US012132054B2

(12) United States Patent
Yoon et al.

(10) Patent No.: US 12,132,054 B2
(45) Date of Patent: Oct. 29, 2024

(54) ELECTRONIC DEVICE, MANUFACTURING METHOD OF ELECTRONIC DEVICE, AND METHOD FOR ATTACHING A LIGHT EMITTING ELEMENT TO A SUBSTRATE

(71) Applicant: Samsung Display Co., LTD., Yongin-si (KR)

(72) Inventors: Jangyeol Yoon, Seoul (KR); JaeMin Shin, Suwon-si (KR); Jongho Hong, Yongin-si (KR)

(73) Assignee: SAMSUNG DISPLAY CO., LTD., Yongin-si (KR)

( * ) Notice: Subject to any disclaimer, the term of this patent is extended or adjusted under 35 U.S.C. 154(b) by 0 days.

(21) Appl. No.: 16/797,736

(22) Filed: Feb. 21, 2020

(65) Prior Publication Data
US 2020/0279870 A1 Sep. 3, 2020

(30) Foreign Application Priority Data

Feb. 28, 2019 (KR) .................. 10-2019-0023758

(51) Int. Cl.
*H01L 27/12* (2006.01)
*H01L 21/683* (2006.01)

(52) U.S. Cl.
CPC ........ *H01L 27/124* (2013.01); *H01L 21/6835* (2013.01); *H01L 27/1248* (2013.01); *H01L 27/1259* (2013.01)

(58) Field of Classification Search
CPC ............... H01L 27/124; H01L 21/6835; H01L 27/1248; H01L 27/1259
USPC ......................................................... 257/72
See application file for complete search history.

(56) References Cited

U.S. PATENT DOCUMENTS

| | | |
|---|---|---|
| 7,228,018 B2 | 6/2007 | Kondo |
| 7,514,718 B2 | 4/2009 | Shin et al. |
| 8,128,672 B2 | 3/2012 | Quisenberry et al. |
| 9,640,715 B2 | 5/2017 | Bower et al. |
| 9,716,085 B2 | 7/2017 | Li et al. |
| 9,773,750 B2 | 9/2017 | Bibl et al. |
| 9,997,501 B2 | 6/2018 | Bower et al. |
| 10,002,856 B1 | 6/2018 | Bedell et al. |

(Continued)

FOREIGN PATENT DOCUMENTS

| | | |
|---|---|---|
| CN | 106941108 | 7/2017 |
| CN | 107393940 | 11/2017 |

(Continued)

OTHER PUBLICATIONS

Tomoyuki Yuba et al., "Soft Baking Effect on Lithographic Performance by Positive Tone Photosensitive Polyimide", Journal of Photopolymer Science and Technology, 2010, vol. 23, No. 6, pp. 775-779.

(Continued)

*Primary Examiner* — Ori Nadav
(74) *Attorney, Agent, or Firm* — KILE PARK REED & HOUTTEMAN PLLC

(57) ABSTRACT

Provided is a manufacturing method of an electronic device, including forming a circuit layer on a base layer, disposing a light emitting element for attachment over the circuit layer, disposing an insulating layer between the light emitting element and the circuit layer, and drying the insulation layer to attach the light emitting element with the insulating layer and the circuit layer.

15 Claims, 22 Drawing Sheets

(56) References Cited

U.S. PATENT DOCUMENTS

| | | | |
|---|---|---|---|
| 10,020,420 B2 | 7/2018 | Zou et al. | |
| 10,070,568 B2 | 9/2018 | Pourchet et al. | |
| 10,128,307 B2 | 11/2018 | Chang | |
| 10,135,011 B2 | 11/2018 | Park et al. | |
| 10,263,138 B2 | 4/2019 | Lu | |
| 10,468,396 B2* | 11/2019 | Kim | G06F 3/1446 |
| 2007/0087537 A1* | 4/2007 | Kadoshima | H01L 21/28097 438/585 |
| 2013/0288409 A1* | 10/2013 | Chen | H01L 33/0095 438/29 |
| 2014/0094878 A1 | 4/2014 | Gossler et al. | |
| 2014/0225136 A1 | 8/2014 | Kim et al. | |
| 2014/0340900 A1 | 11/2014 | Bathurst et al. | |
| 2014/0367655 A1* | 12/2014 | Takii | H01L 51/56 257/40 |
| 2016/0254275 A1* | 9/2016 | Feng | H01L 27/1259 257/72 |
| 2017/0040306 A1 | 2/2017 | Kim et al. | |
| 2017/0338252 A1* | 11/2017 | Lee | H01L 27/1251 |
| 2018/0242402 A1* | 8/2018 | Jeong | H05B 3/141 |
| 2018/0301441 A1 | 10/2018 | Han | |
| 2018/0333945 A1 | 11/2018 | Li et al. | |
| 2018/0342643 A1* | 11/2018 | Lu | H01L 33/005 |
| 2018/0348574 A1 | 12/2018 | Lin et al. | |
| 2019/0019816 A1 | 1/2019 | Kang et al. | |
| 2019/0035817 A1 | 1/2019 | Park | |
| 2019/0164946 A1 | 5/2019 | Fu et al. | |

FOREIGN PATENT DOCUMENTS

| | | |
|---|---|---|
| CN | 109300931 | 2/2019 |
| JP | 2003-59555 | 2/2003 |
| KR | 10-2017-0110214 | 10/2017 |
| KR | 10-2018-0059157 | 6/2018 |
| KR | 10-2018-0081378 | 7/2018 |
| KR | 10-2018-0102422 | 9/2018 |
| KR | 10-2018-0104071 | 9/2018 |
| KR | 10-1902566 | 9/2018 |
| KR | 10-2018-0115173 | 10/2018 |
| KR | 10-2018-0131496 | 12/2018 |
| KR | 10-2019-0012029 | 2/2019 |
| WO | 2013/119671 | 8/2013 |

OTHER PUBLICATIONS

Xiaolei Zhang et al., "The Effect of Soft Bake on Adhesion Property Between SU-8 Photoresist and Ni Substrate by Molecular Dynamics Simulation", Journal of Applied Polymer Science, 2013 (published Jun. 6, 2012), pp. 4456-4462, Wiley Periodicals, Inc.

Extended European Search Report corresponding to European Application or Patent No. 20158479.4 dated Jul. 23, 2020.

\* cited by examiner

ELECTRONIC DEVICE, MANUFACTURING METHOD OF ELECTRONIC DEVICE, AND METHOD FOR ATTACHING A LIGHT EMITTING ELEMENT TO A SUBSTRATE

CROSS-REFERENCE TO RELATED APPLICATIONS

This U.S. non-provisional patent application claims priority under 35 U.S.C. § 119 of Korean Patent Application No. 10-2019-0023758, filed in the Korean Intellectual Property Office on Feb. 28, 2019, the entire contents of which are hereby incorporated by reference.

BACKGROUND

The disclosure relates to an electronic device having improved reliability and manufacturing yield, a manufacturing method of the electronic device, and a method for transferring a light emitting element.

An electronic device may include a light emitting element. The light emitting element may be electrically connected to an electrode, and emit light according to a voltage applied to the electrode. A light emitting element may be directly formed on an electrode, or a light emitting element formed separately from an electrode may be connected to the electrode. When a light emitting element is separately formed and then connected to an electrode, a process is required to align the light emitting element on the electrode. When not aligned properly on the electrode, the light emitting element may not emit light.

SUMMARY

The disclosure provides an electronic device having improved reliability and manufacturing yield, a manufacturing method of the electronic device, and a method for transferring a light emitting element.

An embodiment may include a manufacturing method of an electronic device including: forming a circuit layer on a base layer; disposing a light emitting element for attachment over the circuit layer; disposing an insulating layer between the light emitting element and the circuit layer; and drying the insulation layer to attach the light emitting element with the insulating layer and the circuit layer.

In an embodiment, the disposing of the insulating layer may include coating the insulation layer on the circuit layer; and the disposing of the light emitting element may include attaching the light emitting element with the insulation layer.

In an embodiment, the disposing of the light emitting element may include detaching the light emitting element from a transport layer.

In an embodiment, the transport layer may be an ultraviolet curable tape, and the detaching of the light emitting element may include irradiating the transport layer with an ultraviolet ray.

In an embodiment, the disposing of the light emitting element may include attaching the light emitting element on a transport layer; and the disposing of the insulating layer may include coating the insulation layer on the transport layer and the light emitting element.

In an embodiment, the disposing of the light emitting element may include detaching the light emitting element and a portion of the insulating layer coated thereon from the transport layer and another portion of the insulating layer coated on the transport layer.

In an embodiment, the insulation layer may include a polyimide-based resin.

In an embodiment, the manufacturing method may further include forming a connection electrode electrically connecting the light emitting element and the circuit layer.

In an embodiment, the manufacturing method may further include patterning the insulation layer by employing the light emitting element as a mask.

In an embodiment, a level of adhesion of the insulation layer may be higher after the drying than before the drying.

In an embodiment, the insulation layer may have a thinner thickness than a thickness of the light emitting element.

In an embodiment, the attaching may include heating the insulation layer.

In an embodiment, the forming of the base layer may include forming island portions and bridge portions connecting the island portions.

In an embodiment, an electronic device may include a base layer; a circuit layer disposed on the base layer; a first insulation layer disposed on the circuit layer; a light emitting element disposed on the first insulation layer; and a connection electrode disposed on the light emitting element and electrically connecting the light emitting element and the circuit layer, wherein a shape of the first insulation layer may correspond to a shape of the light emitting element.

In an embodiment, the electronic device may further include a second insulation layer disposed on the circuit layer and around the light emitting element.

In an embodiment, a thickness of the first insulation layer may be thinner than a thickness of the second insulation layer In an embodiment, the first insulation layer may include a polyimide-based resin.

In an embodiment, the electronic device may further include a heat sink layer disposed between the circuit layer and the first insulation layer.

In an embodiment, the thickness of the first insulation layer may be about 1 micrometer to about 4 micrometers, and the thickness of the second insulation layer may be about 3 micrometers to about 7 micrometers.

In an embodiment, the electronic device may further include: a first intermediate electrode disposed on the second insulation layer, and electrically connected to the circuit layer; and a third insulation layer disposed on the second insulation layer, and covering the first intermediate electrode and the light emitting element, wherein the connection electrode is disposed on the third insulation layer to be electrically connected to the first intermediate electrode and the light emitting element.

In an embodiment, the electronic device may further include: a second intermediate electrode disposed on the third insulation layer, and electrically connected to the first intermediate electrode; and a fourth insulation layer disposed on the third insulation layer, and covering the second intermediate electrode, wherein the connection electrode is disposed on the fourth insulation layer to be electrically connected to the second intermediate electrode and the light emitting element.

In an embodiment, the base layer may include island portions separated from each other, and bridge portions connecting the island portions.

In an embodiment, the circuit layer may include thin-film transistors and signal lines electrically connected to the thin-film transistors, wherein the thin-film transistors are disposed on the island portions, and the signal lines are disposed on the bridge portions.

In an embodiment, the electronic device may include a plurality of light emitting elements, and at least one of the light emitting elements may be disposed on a respective one of the island portions.

In an embodiment, a method for attaching a light emitting element to a substrate includes: disposing a light emitting element on a transport layer; disposing an insulating layer between the light emitting element on the transport layer and the substrate; moving the transport layer to a position over the substrate; drying the insulation layer to attach the light emitting element with the substrate; and separating the transport layer from the light emitting element.

In an embodiment, the disposing of the insulating layer may include coating the insulation layer on the circuit substrate.

In an embodiment, the disposing of the insulating layer may include coating the insulation layer on the transport layer and the light emitting element.

In an embodiment, the transport layer may be an ultraviolet curable tape, and the separating operation may include irradiating the ultraviolet curable tape with an ultraviolet ray.

BRIEF DESCRIPTION OF THE FIGURES

The accompanying drawings are included to provide an additional appreciation of the disclosure when read in light of the specification. The drawings illustrate embodiments of the disclosure, in which.

DETAILED DESCRIPTION

Figure 1:
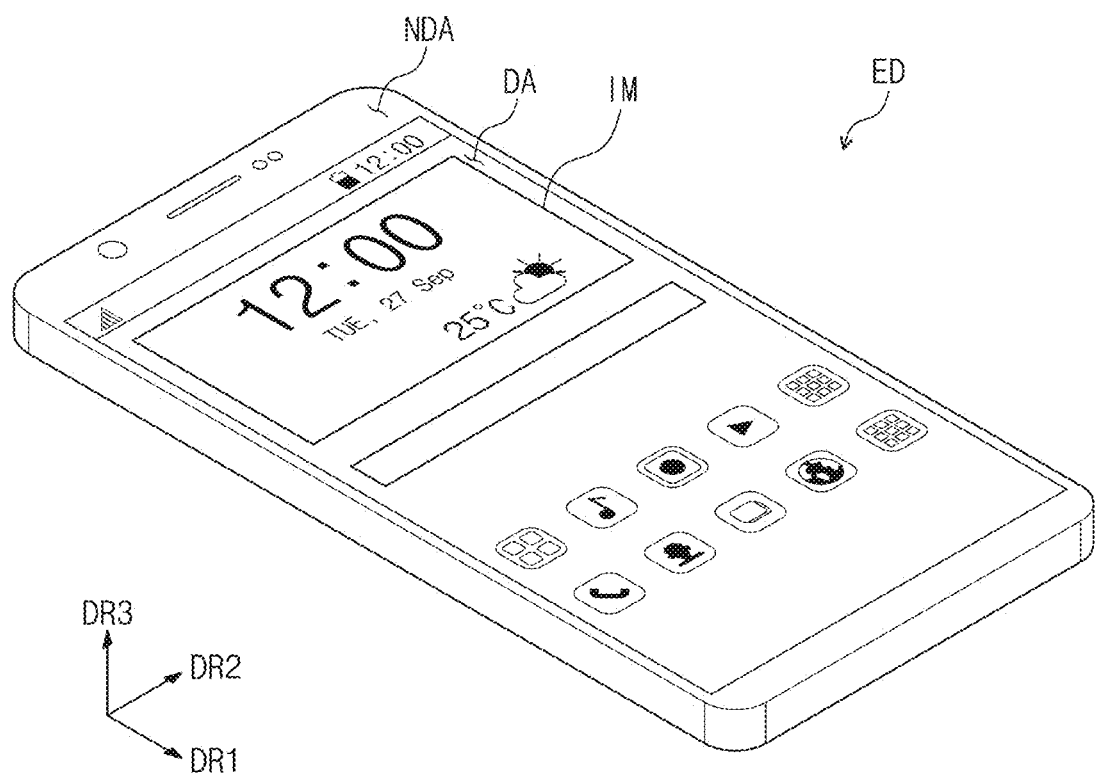
FIG. 1 is a perspective view of an electronic device according to an embodiment.

It will be understood that when an element or layer is referred to as being "on", "connected to" or "coupled to" another element or layer, it can be directly on, connected or coupled to the other element or intervening third elements may be present.

Like reference numerals in the drawings refer to like elements. In addition, in the drawings, the thickness, the ratio, and the dimension of the element may be exaggerated for effective description of the technical contents.

The term "and/or" includes any and all combinations of one or more of the associated items.

Terms such as first, second, and the like may be used to describe various components, but these components should not be limited by the terms. The terms are used only for the purpose of distinguishing one component from another component. For instance, a first component may be referred to as a second component, or similarly, a second component may be referred to as a first component, without departing from the scope of the present disclosure. The singular forms "a," "an" and "the" are intended to include the plural forms as well, unless the context clearly indicates otherwise.

In addition, the terms such as "under", "lower", "on", and "upper" are used for explaining associations of items illustrated in the drawings. It will be understood that the spatially relative terms are intended to encompass different orientations of the device in use or operation in addition to the orientation depicted in the figures.

The phrase "in a plan view" means when an object portion is viewed from above, and the phrase "in a schematic cross-sectional view" means when a cross-section taken by vertically cutting an object portion is viewed from the side. Additionally, the terms "overlap" or "overlapped" mean that a first object may be above or below or to a side of a second object, and vice versa.

Unless otherwise defined, all terms (including technical and scientific terms) used herein have the same meaning as commonly understood by one of ordinary skill in the art to which example embodiments belong. It will be further understood that terms, such as those defined in commonly-used dictionaries, should be interpreted as having a meaning that is consistent with their meaning in the context of the relevant art and will not be interpreted in an idealized or overly formal sense unless expressly so defined herein.

It will be further understood that the terms "includes" and/or "including", when used in this specification, specify the presence of stated features, integers, steps, operations, elements, components or combinations thereof, but do not preclude the presence or addition of one or more other features, integers, steps, operations, elements, components, or combinations thereof.

Hereinafter, embodiments of the disclosure are described with reference to the accompanying drawings.

FIG. 1 is a perspective view of an electronic device ED according to an embodiment.

Referring to FIG. 1, the electronic device ED may be a display device that displays an image. The electronic device ED may be used in a large electronic device such as a television, a monitor, or an external billboard, and also used in a small and medium electronic device such as a personal computer, a notebook computer, a personal digital terminal, a car navigation unit, a game console, a portable electronic device, or a camera. The electronic device ED may also be employed in other electronic devices.

A display area DA and a non-display area NDA may be defined in the electronic device ED.

The display area DA on which an image IM is displayed is parallel to a surface defined by a first direction DR1 and a second direction DR2. The normal direction of the display area DA, namely, the thickness direction of the electronic device ED is indicated by a third direction DR3. The front surface (or top surface) and the rear surface (or bottom surface) of each member are distinguished by the third direction DR3. However, directions indicated by the first to third directions DR1, DR2, and DR3 are relative, and may be changed to other directions. Hereinafter, the first to third directions are directions respectively indicated by the first to third directions DR1, DR2, and DR3.

The non-display area NDA may be an area adjacent to the display area DA, and the image IM is not displayed thereon. A bezel area of the electronic device ED may be defined by the non-display area NDA.

The non-display area NDA may surround or be around a periphery of the display area DA. The shape of the display area DA and the shape of the non-display area NDA may be relatively designed, and further, the non-display area NDA may be omitted.

Figure 2:
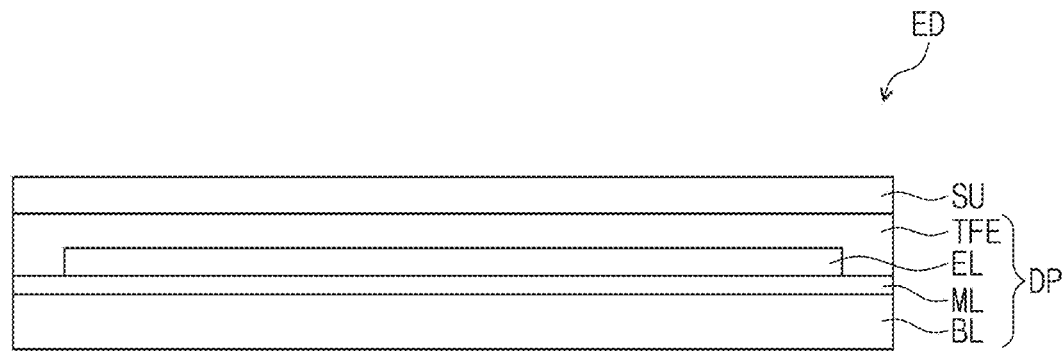
FIG. 2 is a schematic cross-sectional view of an electronic device according to an embodiment.
Figure 2:
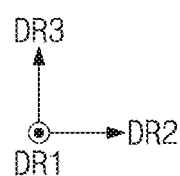

FIG. 2 is a schematic cross-sectional view of the electronic device ED according to an embodiment.

In relation to FIG. 2, the electronic device ED may include a display panel DP and a sensing unit SU.

The display panel DP may be a microminiature light emitting element display panel DP including a microminiature light emitting element. For example, the display panel DP may be a micro light emitting element display panel.

The display panel DP may include a base layer BL, a circuit layer ML, a light emitting element layer EL, and a thin film encapsulation layer TFE.

The base layer BL may include a flexible material. For example, the base layer BL may be a plastic substrate. The plastic substrate may include at least one of an acrylic-based resin, a methacrylic-based resin, polyisoprene, a vinyl-based resin, an epoxy-based resin, a urethane-based resin, a cellulose-based resin, a siloxane-based resin, a polyimide-based resin, a polyamide resin, and a perylene-based resin. For example, the base layer BL may include a polyimide-based resin of a single layer. However, the base layer BL may be a laminated structure including a plurality of insulation layers. In another embodiment, the base layer BL may include a rigid material, and for example, may be a glass substrate.

The circuit layer ML may be disposed on the base layer BL. The circuit layer ML may include insulation layers, conductive layers, and semiconductor layers.

The light emitting element layer EL may be disposed on the circuit layer ML. The light emitting element layer EL includes a display element, for example, a micro light emitting element. The micro light emitting element may be a light emitting diode (LED).

The thin film encapsulation layer TFE may encapsulate the light emitting element layer EL. The thin-film encapsulation layer TFE may include a plurality of inorganic layers and at least one organic layer disposed therebetween. In addition, the thin film encapsulation layer TFE may further include a buffer layer. The buffer layer may be a layer most adjacent to the sensing unit SU. The buffer layer may be an inorganic layer or an organic layer.

The sensing unit SU may include a circuit for sensing a touch. A touch sensing type of the sensing unit SU may be a resistive film type, an optical type, a static capacitive type, an ultrasonic type, or the like, and is not limited thereto. Among them, the sensing unit SU of the static capacitive type may detect whether a touch is generated using static capacitance that changes when a touch generation means contacts a screen of the electronic device ED. The static capacitive type may be divided into a mutual static capacitive type and a self static capacitive type.

The sensing unit SU may be directly disposed on the display panel DP. The phrase "being directly disposed" excludes "being attached with a separate adhesive member", and means "being provided through continuous processes," such that the sensing unit SU and the display panel DP may be formed as a unitary, one-piece construction. However, the display panel DP and the sensing unit SU may be combined to each other with an adhesive material (not shown), or the sensing unit SU may be omitted.

Figure 3:
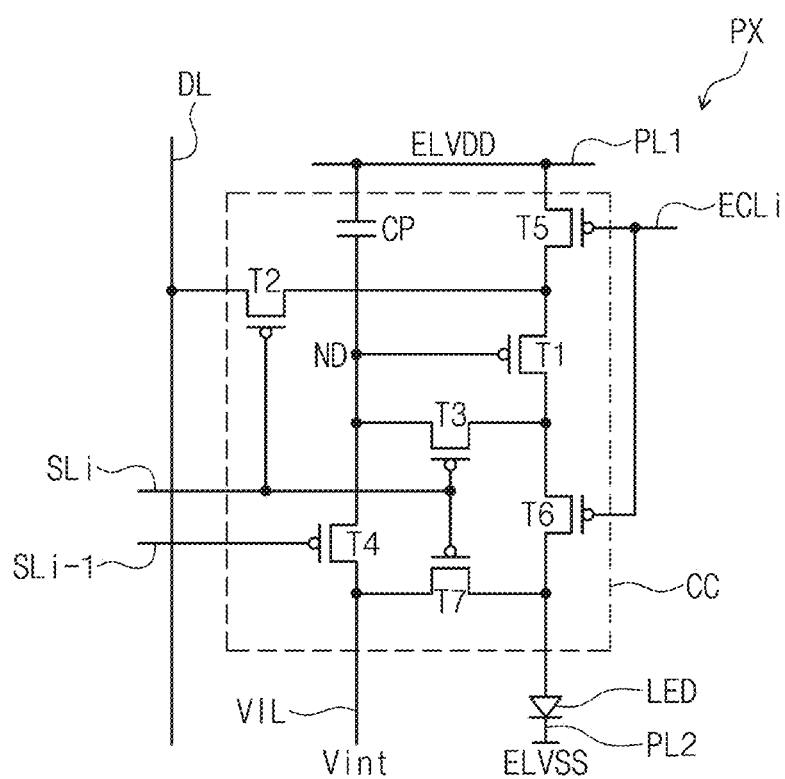
FIG. 3 is an equivalent circuit diagram of a pixel according to an embodiment.

FIG. 3 is an schematic diagram of an equivalent circuit of a pixel PX according to an embodiment.

Referring to FIG. 3, the pixel PX is disposed in the display area DA (see FIG. 1), and may implement an image.

The pixel PX may be electrically connected with signal lines. Among the signal lines in FIG. 3, scan lines SLi and SLi−1, a data line DL, a first power line PL1, a second power line PL2, an initialization power line VIL, and an emission control line ECLi are illustrated as an example. However, the pixel PX may be additionally connected to various signal lines, and a part of the shown signal lines may be omitted.

The pixel PX may include a light emitting element LED and a pixel circuit CC. The light emitting element LED may be a component included in the light emitting element layer EL in FIG. 2, and the pixel circuit CC may be a component included in the circuit layer ML in FIG. 2.

The pixel circuit CC may include transistors T1 to T7 and a capacitor CP. The pixel circuit CC may control an amount of a current flowing through the light emitting element LED in correspondence to a data signal.

The light emitting element LED may emit light at a prescribed luminance in correspondence to the current amount provided from the pixel circuit CC. To this end, the level of a first power supply voltage ELVDD may be set higher than that of a second power supply voltage ELVSS.

Each of the transistors T1 to T7 may include an input electrode (or source electrode), an output electrode (or drain electrode), and a control electrode (or gate electrode). Any one of the input electrode and the output electrode may be referred to as a first electrode, and the other may be referred to as a second electrode.

The first electrode of the first transistor T1 may be connected to a first power line PL1 via the fifth transistor T5. The first power line PL1 may be a line through which the first power supply voltage ELVDD is provided. The second electrode of the first transistor T1 may be connected to an anode electrode of the light emitting element LED via the sixth transistor T6. The first transistor T1 may be referred to as a driving transistor in the present specification.

The first transistor T1 may control an amount of a current flowing through the light emitting element LED in correspondence to a voltage applied to the control electrode of the first transistor T1.

The second transistor T2 may be connected between the data line DL and the first electrode of the first transistor T1. In addition, the control electrode of the second transistor T2 may be connected to the i-th scan line SLi. When an i-th scan signal is provided to the i-th scan line SLi, the second transistor T2 is turned on to electrically connect the data line DL with the first electrode of the first transistor T1.

The third transistor T3 may be connected between the second electrode of the first transistor T1 and the control electrode of the first transistor T1. The control electrode of the third transistor T3 may be connected to the i-th scan line SLi. When the i-th scan signal is provided to the i-th scan line SLi, the third transistor T3 is turned on to electrically connect the second electrode of the first transistor T1 and the control electrode of the first transistor T1. Accordingly, when the third transistor T3 is turned on, the first transistor T1 is diode-connected.

The fourth transistor T4 may be connected between a node ND and the initialization power line VIL. In addition, the control electrode of the fourth transistor T4 may be connected to the (i−1)-th scan line SLi−1. The node ND may be a node at which the control electrodes of the fourth transistor T4 and the first transistor T1 are connected. When an (i−1)-th scan signal is provided to the (i−1)-th scan line SLi−1, the fourth transistor T4 is turned on to provide an initialization voltage Vint to the node ND.

The fifth transistor T5 may be connected between the first power line PL1 and the first electrode of the first transistor T1. The sixth transistor T6 may be connected between the second electrode of the first transistor T1 and the anode electrode of the light emitting element LED. The control electrode of the fifth transistor T5 and the control electrode of the sixth transistor T6 may be connected to the i-th emission control line ECLi.

The seventh transistor T7 may be connected between the initialization power line VIL and the anode electrode of the light emitting element LED. In addition, the control electrode of the seventh transistor T7 may be connected to the i-th scan line SLi. When the i-th scan signal is provided to the i-th scan line SLi, the seventh transistor T7 is turned on to provide the initialization voltage Vint to the anode electrode of the light emitting element LED.

The seventh transistor T7 may improve black level representation capability of the pixel PX. In detail, when the seventh transistor T7 is turned on, a parasite capacitor (not shown) of the light emitting element LED may be discharged. At the time of implementing black luminance, the light emitting element LED does not emit light due to a leakage current from the first transistor T1, and thereby the black representation capability may be improved.

Additionally, FIG. 3 illustrates that the control electrode of the seventh transistor T7 may be connected to the i-th scan line SLi. In another embodiment, the control electrode of the seventh transistor T7 may be connected to the (i−1)-th scan line SLi−1 or an (i+1)-th scan line (not shown).

Even though FIG. 3 is illustrated on the basis of a PMOS, the pixel circuit CC may be provided with an NMOS. In another embodiment, the pixel circuit CC may be provided with a combination of the NMOS and PMOS.

The capacitor CP may be disposed between the first power line PL1 and the node ND. The capacitor CP may store a voltage corresponding to a data signal. When the fifth transistor T5 and the sixth transistor T6 are turned on, the current amount flowing through the first transistor T1 may be determined according to the amount of charge stored in the capacitor CP.

The light emitting element LED may be electrically connected to the sixth transistor T6 and the second power line PL2. The light emitting element LED may receive the second power supply voltage ELVSS through the second power line PL2.

The light emitting element LED may emit light at a voltage corresponding to the difference between a signal delivered through the sixth transistor T6 and the second power supply voltage ELVSS received through the second power line PL2.

The light emitting element LED may be a micro light emitting element. In FIG. 3, it is illustrated that one light emitting element LED may be connected between the sixth transistor T6 and the second power line PL2. However, plural light emitting elements LED may be provided and may be connected in parallel.

The structure of the pixel PX is not limited to that illustrated in FIG. 3. In another embodiment, the pixel PX may be otherwise implemented and constructed to cause the light emitting element LED to emit light.

Figure 4A:
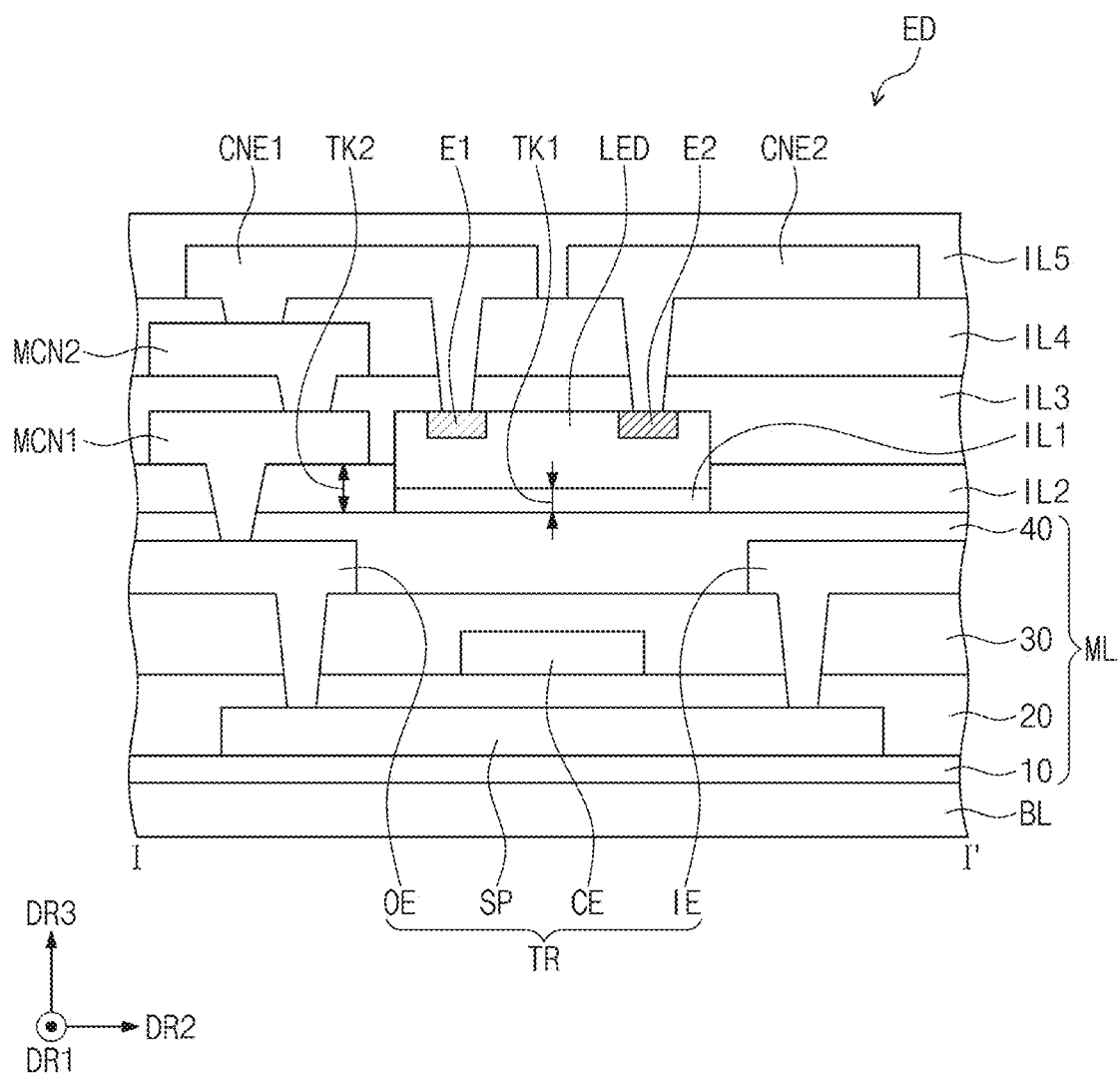
FIG. 4A is a schematic cross-sectional view illustrating a part of an electronic device according to an embodiment.
Figure 4B:
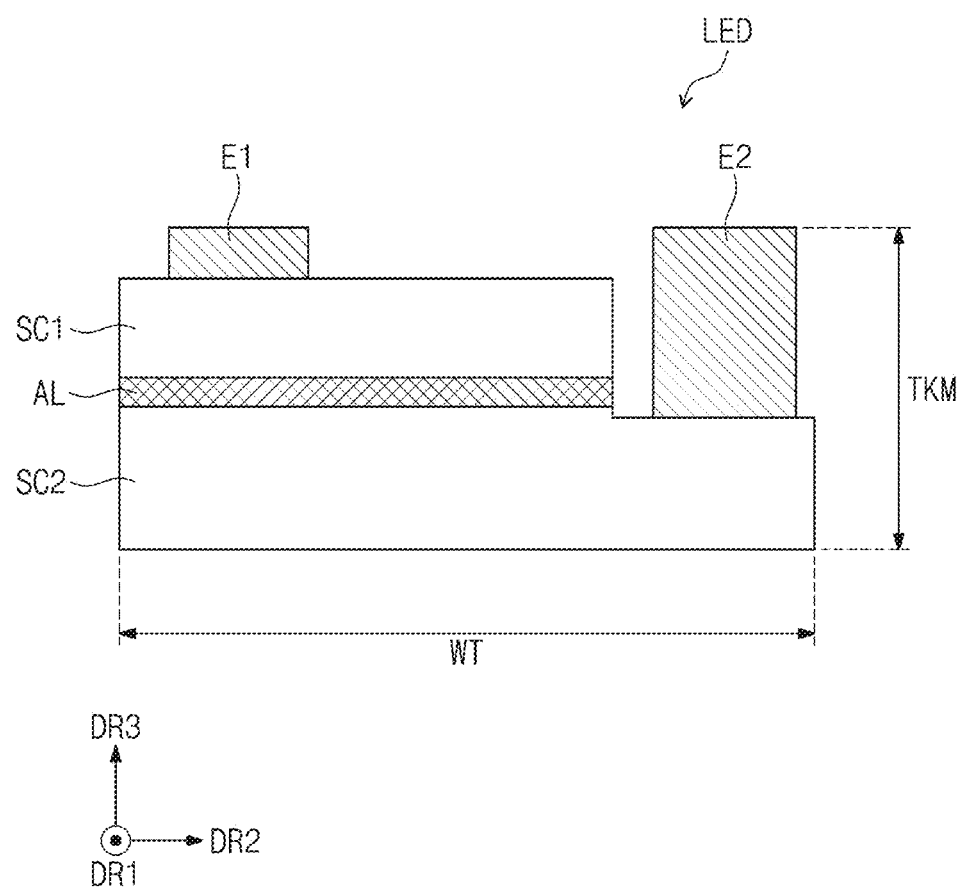
FIG. 4B is a schematic cross-sectional view of a light emitting element according to an embodiment.

FIG. 4A is a schematic cross-sectional view illustrating a part of an electronic device according to an embodiment. FIG. 4B is a schematic cross-sectional view of a light emitting element according to an embodiment.

Referring to FIG. 4A, a first insulation layer 10 may be disposed on the base layer BL. The first insulation layer 10 is illustrated to include a single layer, but may include a plurality of layers. For example, the first insulation layer 10 may include a barrier layer and a buffer layer.

The barrier layer may include an inorganic material. The barrier layer may prevent oxygen or moisture flowed in through the base layer BL from permeating into the pixel PX (see FIG. 3). The buffer layer may include an inorganic material. The buffer layer may provide the pixel PX with surface energy lower than that of the base layer BL so that the pixel PX is stably formed on the base layer BL. The first insulation layer 10 may include one barrier layer and one buffer layer. However, the first insulation layer 10 according to an embodiment may include a plurality of barrier layers and buffer layers stacked alternately in their configuration. As an example, at least any one of the barrier layer and the buffer layer may be provided as a plurality or may be otherwise omitted.

The pixel PX may include a pixel circuit CC (see FIG. 3) and a light emitting element LED. The pixel circuit CC may include transistors T1 to T7 (see FIG. 3) and a capacitor CP (see FIG. 3). FIG. 4A only illustrates one of such transistors TR among components of the pixel circuit CC. The transistor TR may be the first transistor T1 (see FIG. 3).

The transistor TR may be disposed on the first insulation layer 10. The transistor TR may include a semiconductor pattern SP, a control electrode CE, an input electrode IE, and an output electrode OE.

The semiconductor pattern SP may be disposed on the first insulation layer 10. The semiconductor pattern SP may include a semiconductor material. For example, the semiconductor pattern SP may include polysilicon or amorphous silicon. The semiconductor pattern SP may include metal-oxide. The semiconductor pattern SP may include a channel area serving as a passage through which an electron or a hole moves, and first and second ion-doped areas disposed with the channel area therebetween.

A second insulation layer 20 may be disposed on the semiconductor pattern SP to cover or overlap the semiconductor pattern SP. The second insulation layer 20 may include an inorganic material. The inorganic material may include at least any one among silicon nitride, silicon oxy nitride, silicon oxide, titanium oxide, or aluminium oxide.

The control electrode CE may be disposed on the second insulation layer 20. A third insulation layer 30 may be disposed on the control electrode CE to cover the control electrode CE. The third insulation layer 30 may include an inorganic material.

The input electrode IE and the output electrode OE may be disposed on the third insulation layer 30. The input electrode IE and the output electrode OE may be connected to the semiconductor pattern SP through through-holes that penetrate through the second insulation layer 20 and the third insulation layer 30.

A fourth insulation layer 40 may be disposed on the third insulation layer 30 to cover or overlap the input electrode IE and the output electrode OE. The fourth insulation layer 40 may include an inorganic material. The inorganic material may be silicon oxide.

The circuit layer ML may include insulation layers 10, 20, 30 and 40, and the transistor TR. The base layer BL and the circuit layer ML may be referred to as a circuit substrate.

The first insulation layer IL1 may be disposed on the fourth insulation layer 40. In other words, the first insulation layer IL1 may be disposed on the circuit layer ML.

The first insulation layer IL1 may include an organic material. The organic material may be a polymer organic material. The organic material may include at least one among a polyimide-based resin, an acrylic-based resin, a methacrylic-based resin, polyisoprene, a vinyl-based resin, an epoxy-based resin, a urethane-based resin, a cellulose-based resin, a siloxane-based resin, a polyamide resin, and a polycarbonate-based resin, a phenolic-based resin, or a perylene-based resin, but is not limited thereto. The adhesion of the polycarbonate-based resin may be changed according to an applied level of heating according to a temperature thereof. The first insulation layer IL1 may include a material of which a level or degree of adhesion is changed according to an amount or level of a solvent remaining in the first insulation layer IL1 as a result of the application of the heating. Hereinafter, the application of the heating may involve a drying procedure. Thus, implementation of the drying procedure may volatize the solvent and reduce the level of solvent so as to increase a level of adhesion.

The light emitting element LED may be disposed on the first insulation layer IL1. In a plan view, the shape of the first insulation layer IL1 may correspond to the shape of the light emitting element LED. For example, in a plan view, the area of the first insulation layer IL1 may correspond to the area of the light emitting element LED so as to be same or substantially the same in size.

The light emitting element LED may be transferred onto the circuit layer ML based on the adhesion of the first insulation layer IL1. The adhesion of the first insulation layer IL1 may be changed according to an amount of a solvent as effected by, for example, a level of drying the first insulation layer IL1 and the solvent therein. In order to transfer the light emitting element LED from a transport layer (discussed below) and attach it onto the circuit layer ML, the first insulation layer IL1 may be dried at least once. For example, the first insulation layer IL1 may be softly baked. The adhesion of the softly baked first insulation layer IL1 may be higher than that of the first insulation layer IL1 before being softly baked. The light emitting element LED may be transferred onto the circuit layer ML by the softly baked first insulation layer IL1. In other words, the softly baked first insulation layer IL1 may contain a lesser amount of solvent than the non-softly baked first insulation layer IL1, such that the lesser amount of solvent may cause the softly baked first insulation layer IL1 to have a higher level of adhesion than the non-softly baked first insulation layer IL1.

Referring to FIG. 4B, the light emitting element LED may be a micro light emitting element having a width WT of several nanometers to hundreds of micrometers. However, the width WT of the light emitting element LED is merely exemplary, and may not be limited to the above-described numerical range.

The light emitting element LED may include a first electrode E1, a second electrode E2, a first semiconductor layer SC1, a second semiconductor layer SC2 and an active layer AL. The active layer AL may be disposed between the first semiconductor layer SC1 and the second semiconductor layer SC2. The first electrode E1 may be electrically connected to the first semiconductor layer SC1, and the second electrode E2 may be electrically connected to the second semiconductor layer SC2.

The first semiconductor layer SC1 may be a p-type semiconductor layer, and the second semiconductor layer SC2 may be an n-type semiconductor layer. For example, the first semiconductor layer SC1 may provide holes to the active layer AL, and the second semiconductor layer SC2 may provide electrons to the active layer AL.

The first semiconductor layer SC1 may be provided with a semiconductor layer doped with a p-type dopant, and the second semiconductor layer SC2 may be provided with a semiconductor layer doped with an n-type dopant. The semiconductor layers may include a semiconductor material, and the semiconductor material may be, for example, GaN, AlN, AlGaN, InGaN, InN, InAlGaN, AlInN, or a combination thereof. The n-type dopant may be, for example, silicon (Si), germanium (Ge), tin (Sn), selenium (Se), tellurium (Te), or a combination thereof, but is not limited thereto. The p-type dopant may be magnesium (Mg), zinc (Zn), calcium (Ca), strontium (Sr), barium (Ba) or a combination thereof.

The active layer AL may be formed in any one among a single quantum well structure, a multiple quantum well structure, a quantum wire structure, or a quantum dot structure. The active layer AL may be a region in which electrons injected through the second semiconductor layer SC2 and holes injected through the first semiconductor layer SC1 are recombined. The active layer AL is a layer from which light having energy determined by an intrinsic energy band of a material is emitted. The position of the active layer AL may be changed in various ways according to the kind of diode.

Referring to FIG. 4A again, the first insulation layer IL1 may directly contact one surface of the light emitting element LED. The one surface may be the bottom surface of the light emitting element LED on which the first electrode E1 and the second electrode E2 are not disposed.

The second insulation layer IL2 may be disposed on the fourth insulation layer 40. The second insulation layer IL2 may be disposed on the circuit layer ML. The second insulation layer IL2 may be disposed around the light emitting element LED. For example, in a plan view, the second insulation layer IL2 may not overlap the light emitting element LED.

The first insulation layer IL1 and the second insulation layer IL2 may be formed through separate processes. For example, the first insulation layer IL1 may be formed initially, and then the second insulation layer IL2 may be formed subsequently. The second insulation layer IL2 may include the same material as the first insulation layer IL1. For example, the first insulation layer IL1 and the second insulation layer IL2 may include a polyimide-based resin.

In a conventional process, when a separate adhesive or a gum is employed, a bubble may be generated from the adhesive or the gum in the subsequent processes, which lowers encapsulation performance. This may lower the performance of the electronic device. However, according to an embodiment herein, the light emitting element LED may be transferred onto the circuit layer ML using the insulation layer of the electronic device ED, for example, the first insulation layer IL1 that includes the same material as the second insulation layer IL2. In other words, according to an embodiment, the light emitting element LED may be transferred onto the circuit layer ML using a change in level of adhesion of a material used as an existing layer of the electronic device ED. In other words, an additional, separate adhesive or gum of the conventional process is unnecessary for transferring the light emitting element LED onto the circuit layer ML.

A first thickness TK1 of the first insulation layer IL1 may be smaller than the second thickness TK2 of the second insulation layer IL2. For example, the first thickness TK1 may be about 1 micrometer to about 4 micrometers, and the second thickness TK2 may be about 3 micrometers to about 7 micrometers.

Each of the first thickness TK1 and the second thickness TK2 may be smaller than the thickness TKM of the light emitting element LED. For example, when the thickness of the light emitting element LED is about 7 micrometers to about 8 micrometers, each of the first thickness TK1 and the second thickness TK2 may be about 7 micrometers or smaller. For example, it may be about 5 micrometers. However, the first thickness TK1, the second thickness TK2, and the thickness TKM are not limited to the above.

A first intermediate electrode MCN1 may be disposed on the second insulation layer IL2. The first intermediate electrode MCN1 may penetrate through the second insulation layer IL2 and the fourth insulation layer 40 to be electrically connected to the output electrode OE.

A third insulation layer IL3 may be disposed on the second insulation layer IL2. The third insulation layer IL3 may cover or overlap the first intermediate electrode MCN1 and the light emitting element LED. The third insulation layer IL3 may include the same material as the first insulation layer IL1. For example, the third insulation layer IL3 may include a polyimide-based resin, etc.

A second intermediate electrode MCN2 may be disposed on the third insulation layer IL3. The second intermediate electrode MCN2 may penetrate the third insulation layer IL3 to be electrically connected to the first intermediate electrode MCN1.

A fourth insulation layer IL4 may be disposed on the third insulation layer IL3. The fourth insulation layer IL4 may cover or overlap the second intermediate electrode MCN2.

A first connection electrode CNE1 and a second connection electrode CNE2 may be disposed on the fourth insulation layer IL4.

The first connection electrode CNE1 may penetrate through the fourth insulation layer IL4 to be connected to the second intermediate electrode MCN2, and penetrate through the third insulation layer IL3 and the fourth insulation layer IL4 to be connected to the first electrode E1. In other words, the first electrode E1 of the light emitting element LED may be electrically connected to the output electrode OE of the transistor TR through the first connection electrode CNE1, the first intermediate electrode MCN1, and the second intermediate electrode MCN2.

The second connection electrode CNE2 may penetrate through the third insulation layer IL3 and the fourth insulation layer IL4 to be connected to the second electrode E2 of the light emitting element LED. In addition, although not illustrated, the second connection electrode CNE2 may be connected to the second power line PL2 (see FIG. 3). Accordingly, the second power supply voltage ELVSS (see FIG. 3) may be provided to the second electrode E2.

A fifth insulation layer IL5 may be disposed on the fourth insulation layer IL4. The fifth insulation layer IL5 may cover or overlap the first connection electrode CNE1 and the second connection electrode CNE2.

In FIG. 4A, it is illustrated that the third insulation layer IL3, the fourth insulation layer IL4, the first intermediate electrode MCN1, and the second intermediate electrode MCN2 may be disposed on the first insulation layer IL1 and the second insulation layer IL2, but the embodiment is not limited thereto. The amount of the insulation layers and the intermediate electrodes, which are disposed on the first insulation layer IL1 and the second insulation layer IL2, may be smaller and larger according to the thickness of the light emitting element LED.

Figure 5:
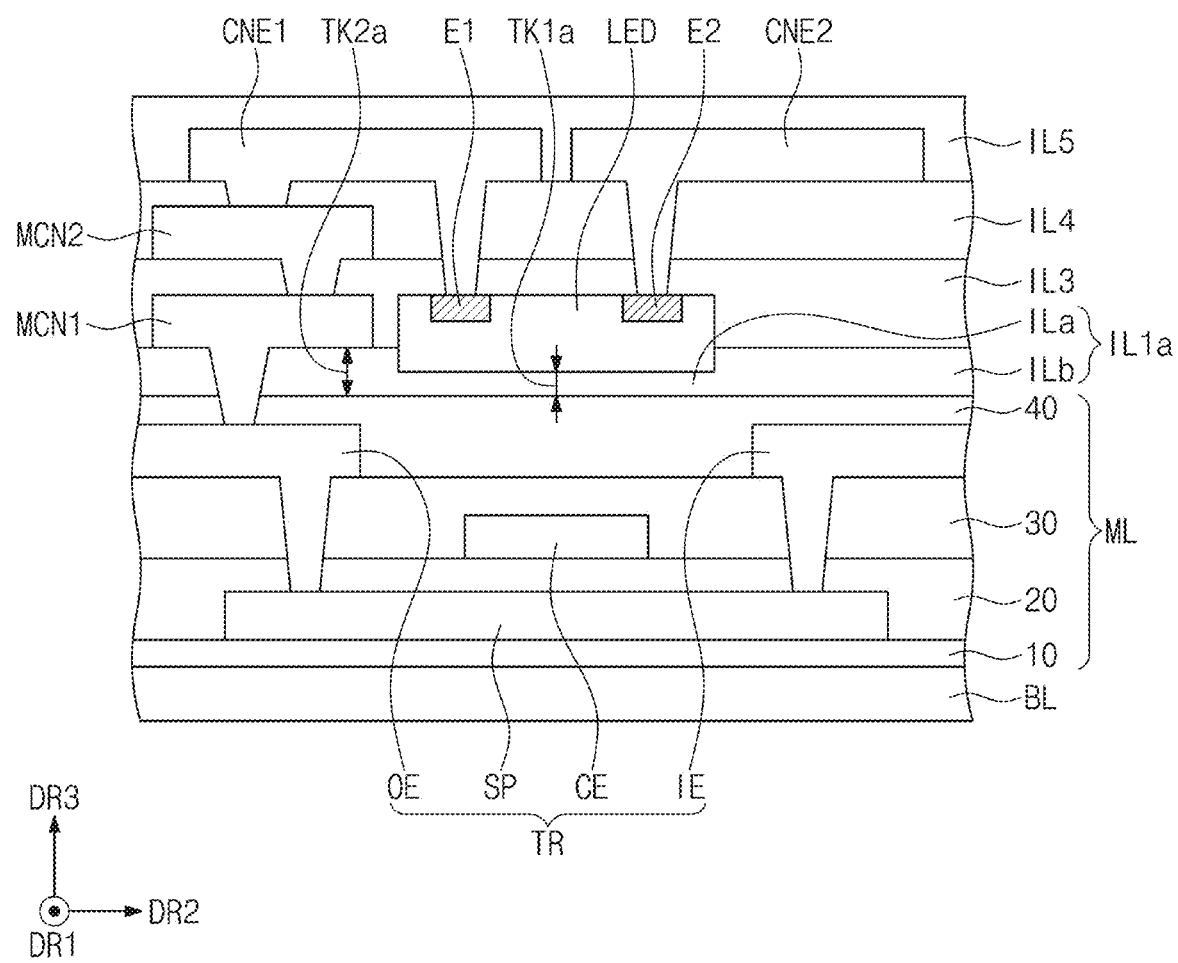
FIG. 5 is a cross-sectional view of a part of an electronic device according to an embodiment of the inventive concept.

FIG. 5 is a schematic cross-sectional view of an electronic device according to an embodiment.

Referring to FIG. 5, the first insulation layer IL1a may be disposed on the fourth insulation layer 40. The first insulation layer IL1a may include a first insulation area ILa under the light emitting element LED and a second insulation area ILb disposed around the light emitting element LED. The first insulation area ILa and the second insulation area ILb may be layers provided substantially simultaneously through a same formation process.

In order to transfer the light emitting element LED onto the circuit layer ML, the first insulation layer IL1a may be dried at least once, for example, the first insulation layer IL1a may be softly baked. The light emitting element LED may be transferred onto the circuit layer ML by the softly baked first insulation layer IL1a. While the light emitting element LED is transferred, a pressure may be applied to the first insulation area ILa of the first insulation layer IL1a. Accordingly, the thickness TK1a of the first insulation area ILa may be smaller than the thickness TK2a of the second insulation area ILb. Accordingly, at least a part of the light emitting element LED in the thickness direction, for example, in the third direction DR3, may be around or surrounded by the first insulation layer IL1a.

Figure 6:
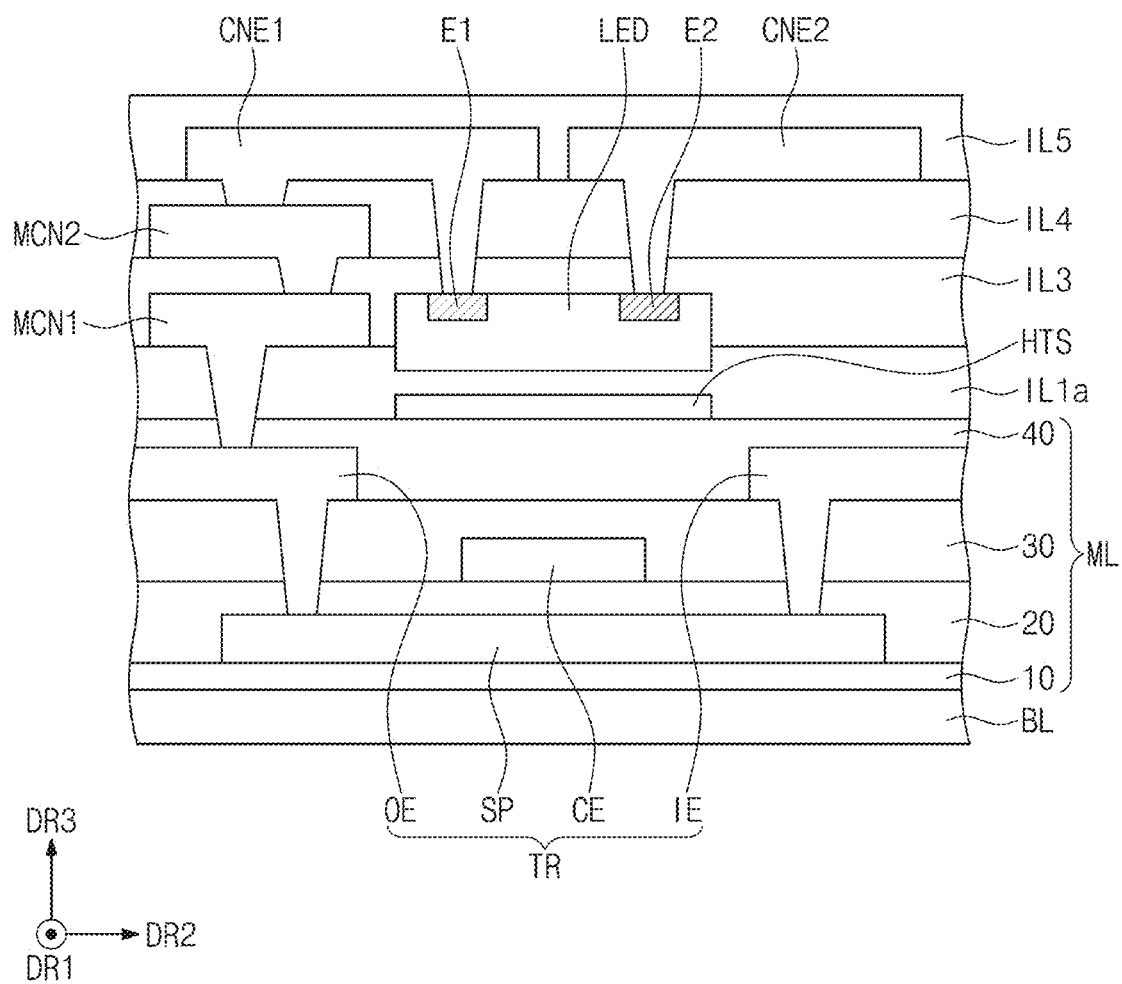
FIG. 6 is a schematic cross-sectional view illustrating a part of an electronic device according to an embodiment.

FIG. 6 is a schematic cross-sectional view illustrating a part of an electronic device according to an embodiment.

Referring to FIG. 6, the first insulation layer IL1a, which directly abuts on the light emitting element LED, may include a high heat resistant material. For example, the first insulation layer IL1a may include a polyimide-based resin. In addition, a heat sink layer HTS may be further disposed between the circuit layer ML and the first insulation layer IL1a. The heat sink layer HTS may be disposed under the light emitting element LED. The heat sink layer HTS may spread heat generated in the light emitting element LED to prevent an increase in temperature in a specific local part of the light emitting element LED.

The heat sink layer HTS may include a material having excellent heat conductivity. For example, the heat sink layer HTS may be a polymer composite material having a metal particle as a filler. The metal particle may include at least any one among aluminium, silver, copper, or nickel. The heat sink layer HTS may be a polymer composite material including ceramic powder. The ceramic powder may include at least any one among aluminium nitride, aluminium oxide, boron nitride, silicon carbide, or beryllium oxide. The heat sink layer HTS may include a carbon composite material. The carbon composite material may include at least one among graphite, carbon nanotube, carbon fiber, or graphene. The heat sink layer HTS may be a metal thin film layer having excellent heat conductivity and light reflectance. The metal thin film layer may include at least any one among aluminium, gold, silver, copper, nickel, or molybdenum.

FIGS. 7A to 7F are schematic cross-sectional views that illustrate a manufacturing method of an electronic device.

Figure 7A:
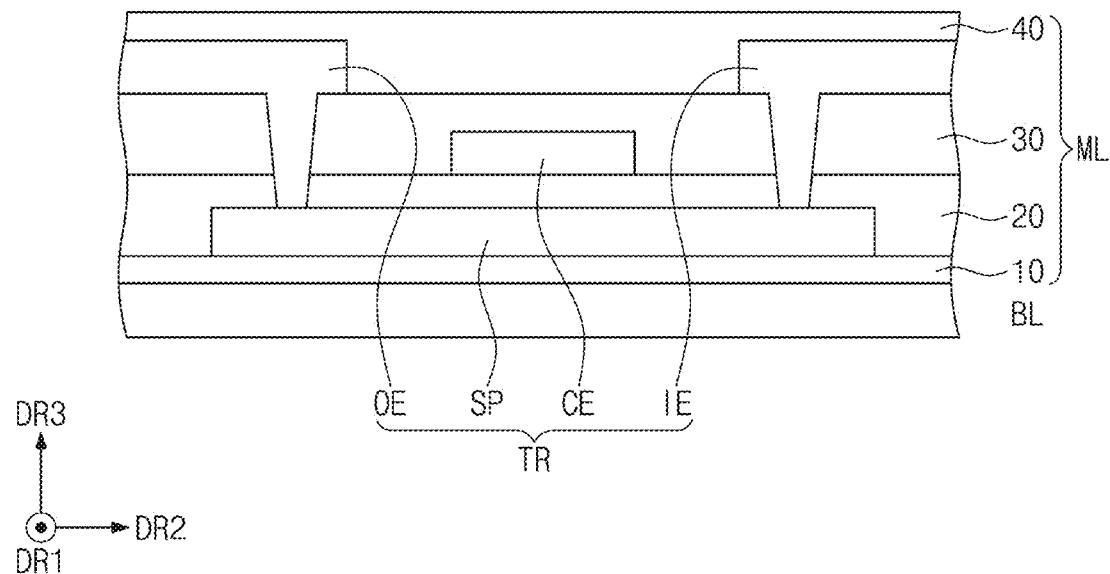
FIGS. 7A to 7F are schematic cross-sectional views that illustrate a manufacturing method of an electronic device according to an embodiment.

Referring to FIG. 7A, a base layer BL is formed. The base layer BL may be formed on a carrier substrate (not shown). The carrier substrate may be, for example, a glass substrate. A circuit layer ML may be formed on the base layer BL.

Figure 7B:
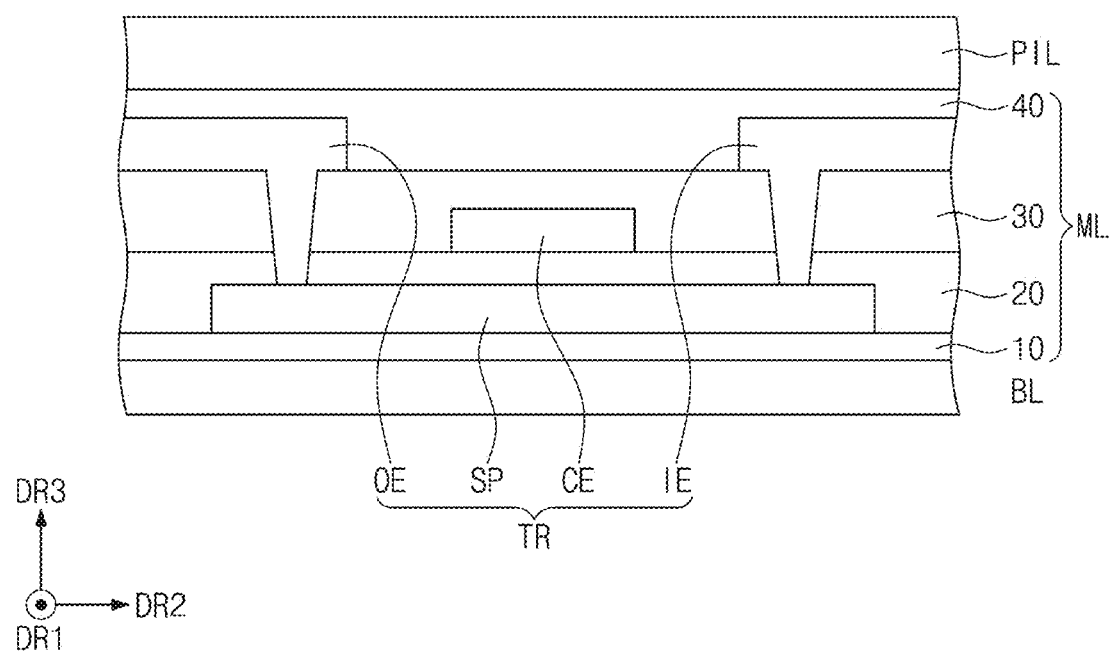

Referring to FIG. 7B, an insulation layer PIL is provided on the circuit layer ML. The insulation layer PIL may be coated on the circuit layer ML. For example, a spin coating process may be employed in forming the insulation layer PIL.

Figure 7C:
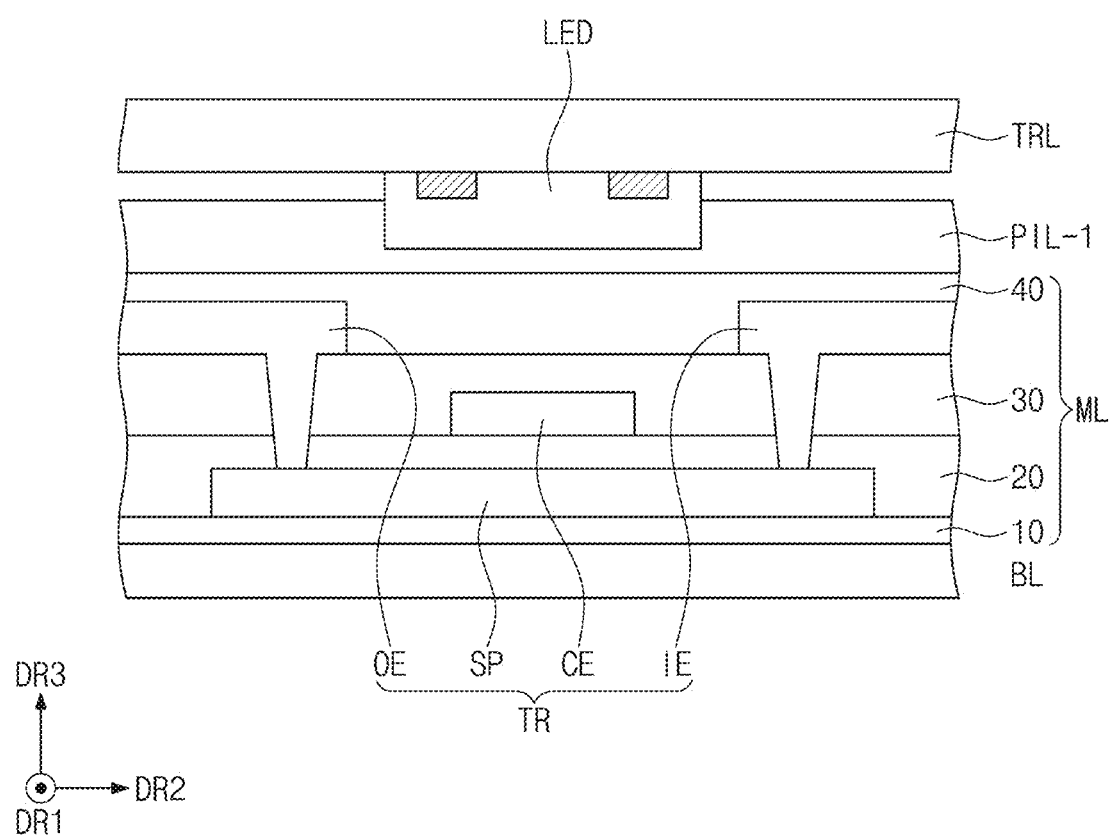

Referring to FIGS. 7B and 7C, a light emitting element LED and a transport layer TRL may be, for example, sequentially disposed on the insulation layer PIL. In other words, in a schematic cross-sectional view, the sequential disposition may include the insulation layer PIL on the circuit layer ML, the light emitting element LED on the insulation layer PIL, and the transport layer TRL on the light emitting element LED.

The insulation layer PIL is dried to form a dried insulation layer PIL-1. An amount of a solvent for the dried insulation layer PIL-1 may be smaller than an amount of a solvent for the insulation layer PIL. The dried insulation layer PIL-1 may mean a softly baked insulation layer PIL. For example, the dried insulation layer PIL-1 may be formed by applying heat according to a prescribed temperature range to the insulation layer PIL for a prescribed time. The prescribed time may be, for example, about 10 seconds to about 3 minutes, and the prescribed temperature range may be about 50 to about 200 degrees Celsius. The prescribed time and the prescribed temperature range may be variously selected to cause the adhesion of the dried insulation layer PIL-1 to be higher than that of the insulation layer PIL.

The light emitting element LED may be put in contact with the dried insulation layer PIL-1. The adhesion between the dried insulation layer PIL-1 and the light emitting element LED may be larger than that between the transport layer TRL and the light emitting element LED. In an embodiment, the light emitting element LED may be put in contact with the insulation layer PIL, and then the insulation layer PIL may be softly baked to provide the dried insulation layer PIL-1.

Figure 7D:
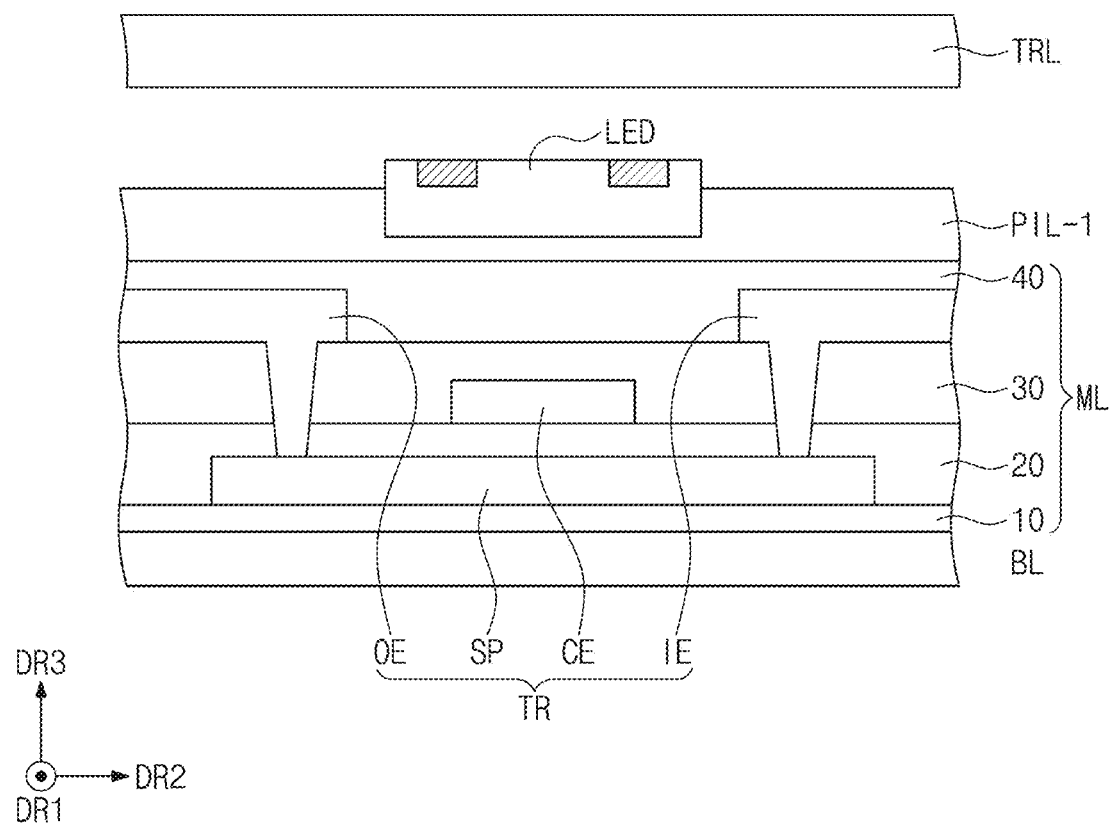

Referring to FIG. 7D, after the light emitting element LED is put in contact with the dried insulation layer PIL-1, the transport layer TRL is separated from the light emitting element LED. The transport layer TRL may be an ultraviolet-curable tape. For example, when the transport layer TRL is irradiated with an ultraviolet ray, the adhesion of the transport layer TRL may be lowered.

The transport layer TRL may be irradiated with the ultraviolet ray, either before the light emitting element LED and the transport layer TRL are arranged on the insulation layer PIL or after the light emitting element LED is put in contact with the dried insulation layer PIL-1.

Figure 7E:
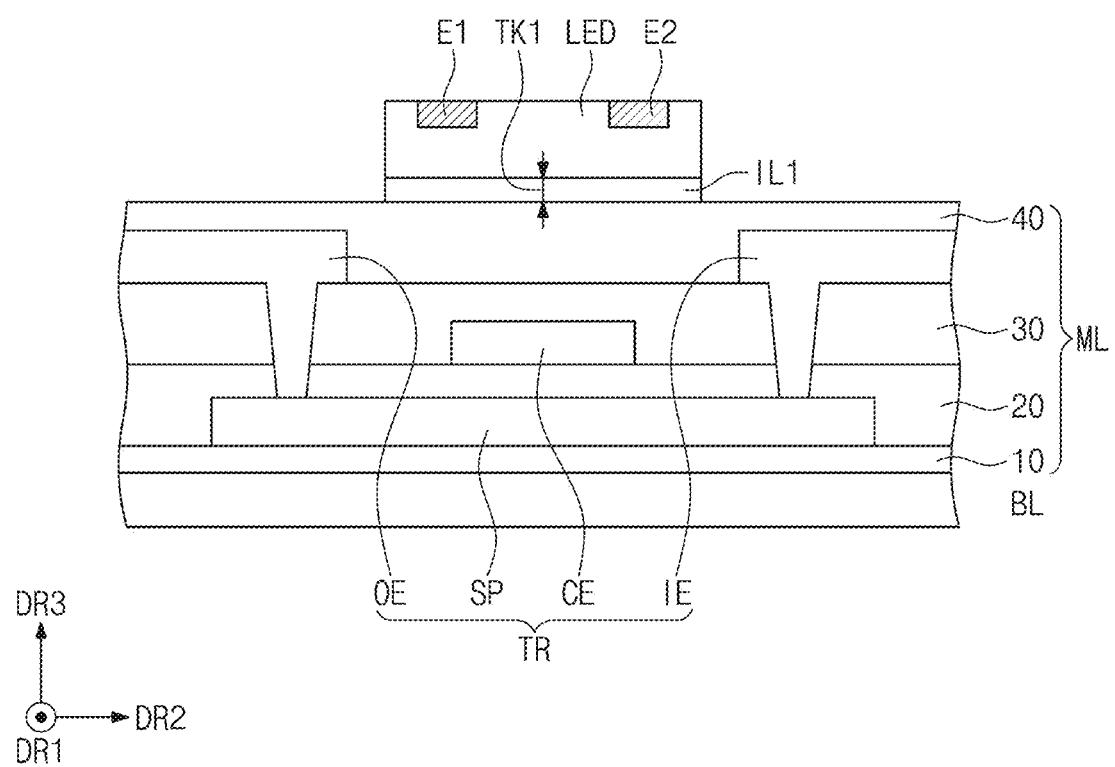

Referring to FIG. 7E, the dried insulation layer PIL-1 may be patterned using the light emitting element LED as a mask. Accordingly, the first insulation layer IL1 may be formed.

Figure 7F:
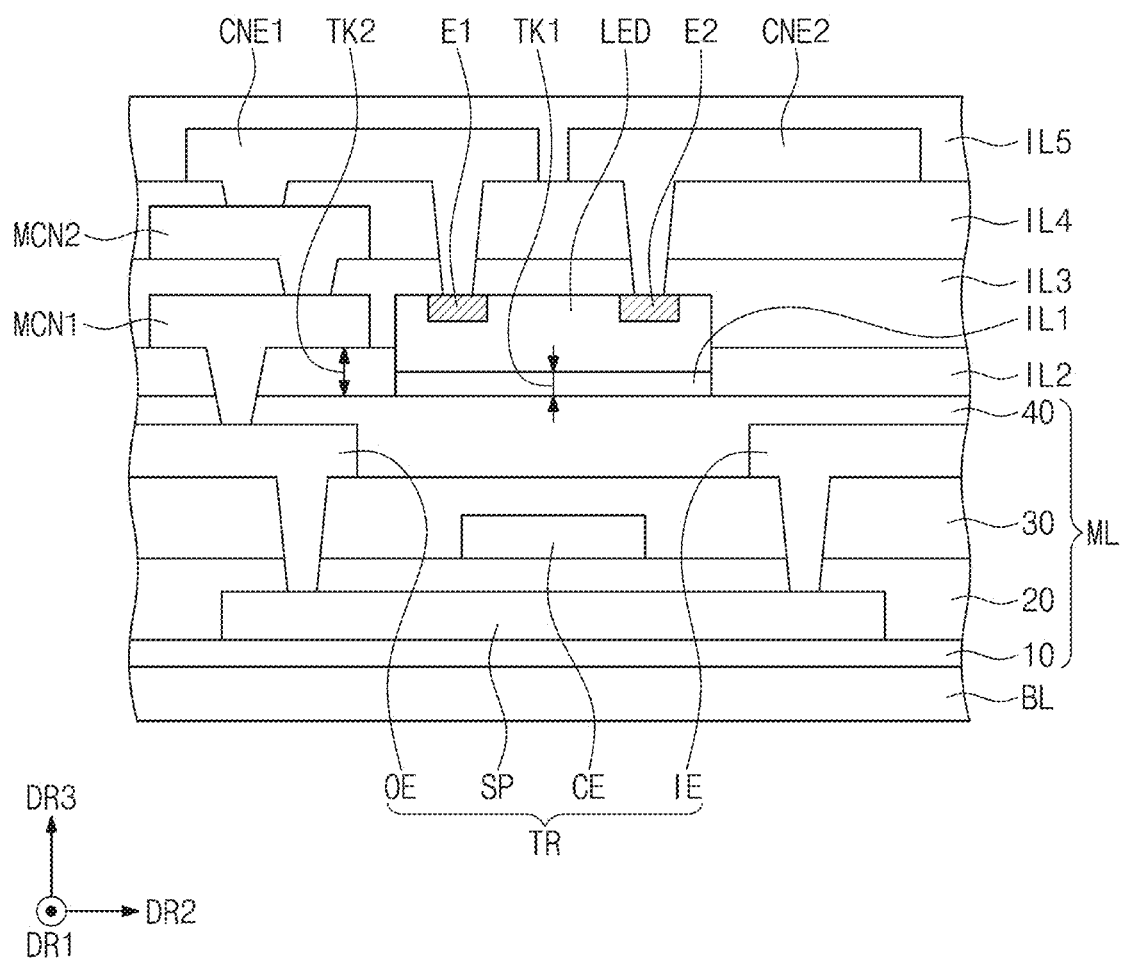

Referring to FIG. 7F, the second insulation layer IL2 may be formed. The second insulation layer IL2 may include the same material as the first insulation layer IL1. For example, the second insulation layer IL2 may include a polyimide-based resin. The second insulation layer IL2 may be provided through a spin coating process.

While the light emitting element LED is transferred, the thickness of the first insulation layer IL1 may be reduced. Accordingly, the thickness of the first insulation layer IL1 may be thinner than that of the second insulation layer IL2.

Thereafter, the first intermediate electrode MCN1, the third insulation layer IL3, the second intermediate electrode MCN2, and the fourth insulation layer IL4 may be sequentially formed. The first connection electrode CNE1 and the second connection electrode CNE2 may be formed to electrically connect the light emitting element LED to the circuit layer ML.

The first insulation layer IL1, which combines the light emitting element LED with the circuit layer ML, may include one among the same materials as the insulation layer included in the display panel DP (see FIG. 2). In other words, since the light emitting element LED is transferred using a change in adhesion according to a solvent amount for the insulation layer, a separate adhesive layer for transferring the light emitting element LED according to a conventional process may be omitted. In the conventional adhesive layer, a bubble may be generated throughout the transfer and consequently cause a reduction in the performance of a display panel. However, in an embodiment herein, the light emitting element LED may be transferred using the adhesive ability of a constituent insulation layer of the display panel DP.

Also in the conventional process, when the connection electrodes are first formed and then the light emitting element LED is transferred, a pressure may be applied to the connection electrodes while the light emitting element LED is transferred, which may damage the connection electrodes. However, according to an embodiment herein, since the first and second connection electrodes CNE1 and CNE2 may be formed after the transfer of the light emitting element LED, the stability of the electrical connection between the light emitting element LED and the circuit layer ML may be improved.

Figure 8A:
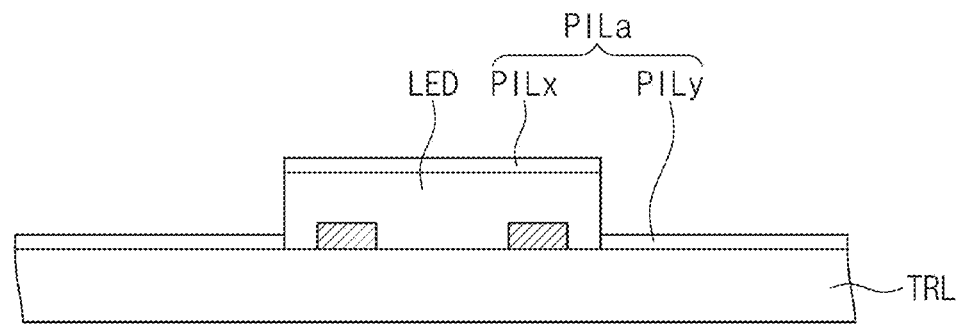
FIGS. 8A to 8C are schematic cross-sectional views that illustrate a manufacturing method of an electronic device according to an embodiment.
Figure 8A:
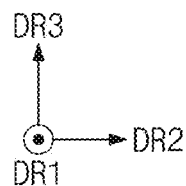
Figure 8B:
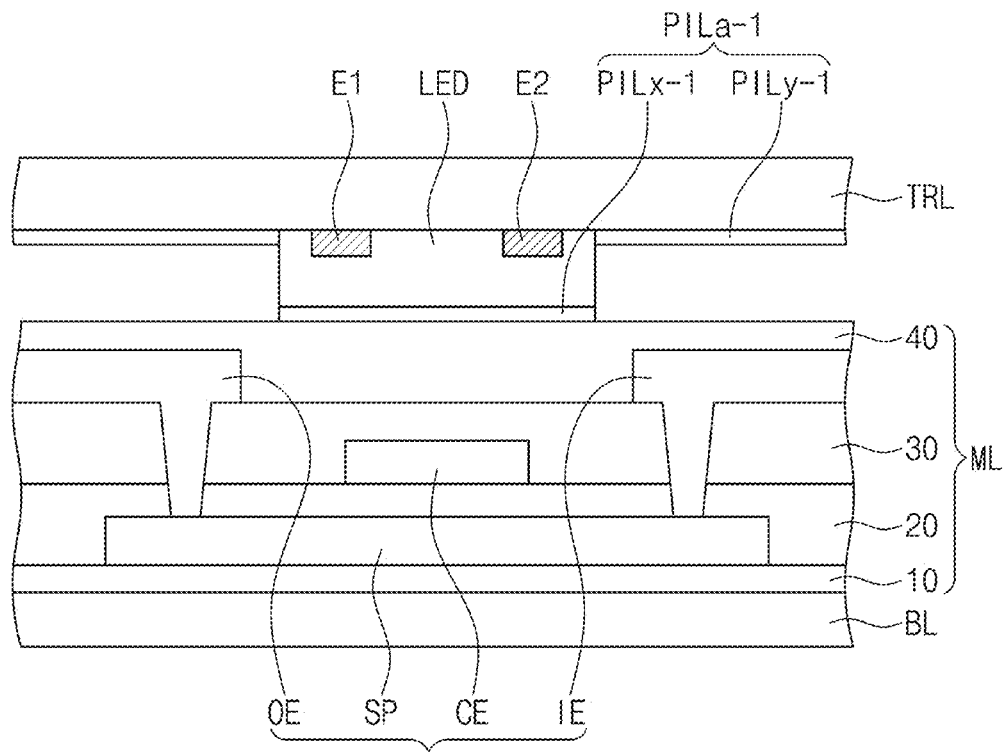
Figure 8B:
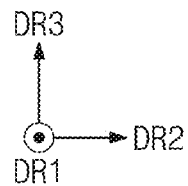
Figure 8C:
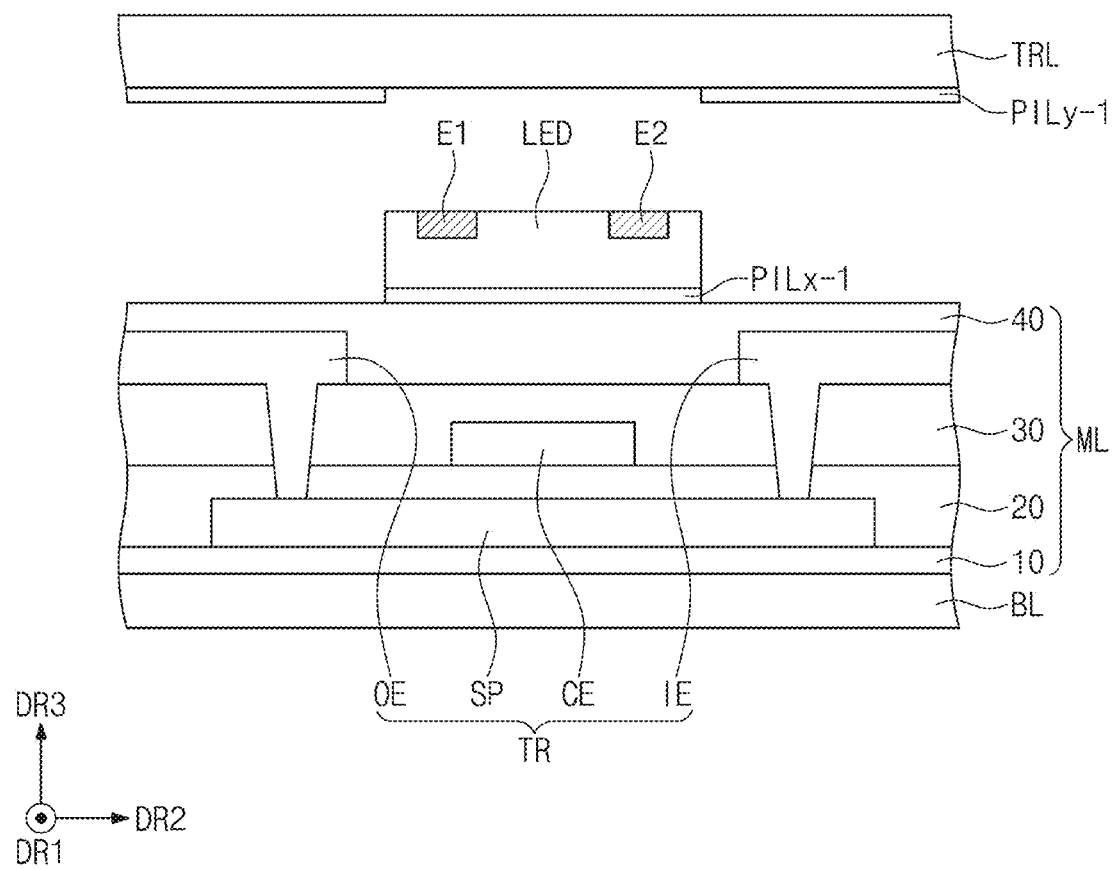

FIGS. 8A to 8C are schematic cross-sectional views that illustrate a manufacturing method of an electronic device according to an embodiment.

Referring to FIG. 8A, the light emitting element LED may be attached to the transport layer TRL. The insulation layer PILa may be coated on the light emitting element LED and the transport layer TRL. The insulation layer PILa may include a first insulation area PILx disposed on the light emitting element LED and a second insulation area PILy disposed on the transport layer TRL.

Referring to FIG. 8B, the insulation layer PILa, the light emitting element LED, and the transport layer TRL may be arranged so as to be sequentially disposed on the circuit layer ML. Then, the insulation layer PILa may be dried. This drying operation may be a soft baking operation. In an embodiment, the insulation layer PILa may be dried first, and then the insulation layer PILa, the light emitting element LED, and the transport layer TRL may be arranged so as to be sequentially disposed on the circuit layer ML.

As the solvent included in the insulation layer PILa volatilizes, the adhesion of the insulation layer PILa may increase. The insulation layer PILa after the soft baking operation is completed is referred to as the dried insulation layer PILa-1. The dried insulation layer PILa-1 may include a first dried insulation region PILx-1 disposed on the light emitting element LED, and a second dried insulation region PILy-1 disposed on the transport layer TRL.

The first dried insulation region PILx-1 may be attached to the circuit layer ML. For example, the first dried insulation region PILx-1 may be attached to the fourth insulation layer 40. The adhesion between the first dried insulation region PILx-1 and the fourth insulation layer 40 and the adhesion between the first dried insulation region PILx-1 and the light emitting element LED may be higher than that between the light emitting element LED and the transport layer TRL since, as has been discussed, the transport layer TRL may be an ultraviolet curable tape such that the light emitting element LED may be separated from the transport layer TRL via irradiation of an ultraviolet light.

Referring to FIG. 8C, the transport layer TRL may be separated from the light emitting element LED. The light emitting element LED may be attached to the circuit layer ML with the first dried insulation region PILx-1 therebetween, and the second dried insulation region PILy-1 and the transport layer TRL may be separated from the light emitting element LED.

FIGS. 9A to 9E are schematic cross-sectional views that illustrate a manufacturing method of an electronic device.

Figure 9A:
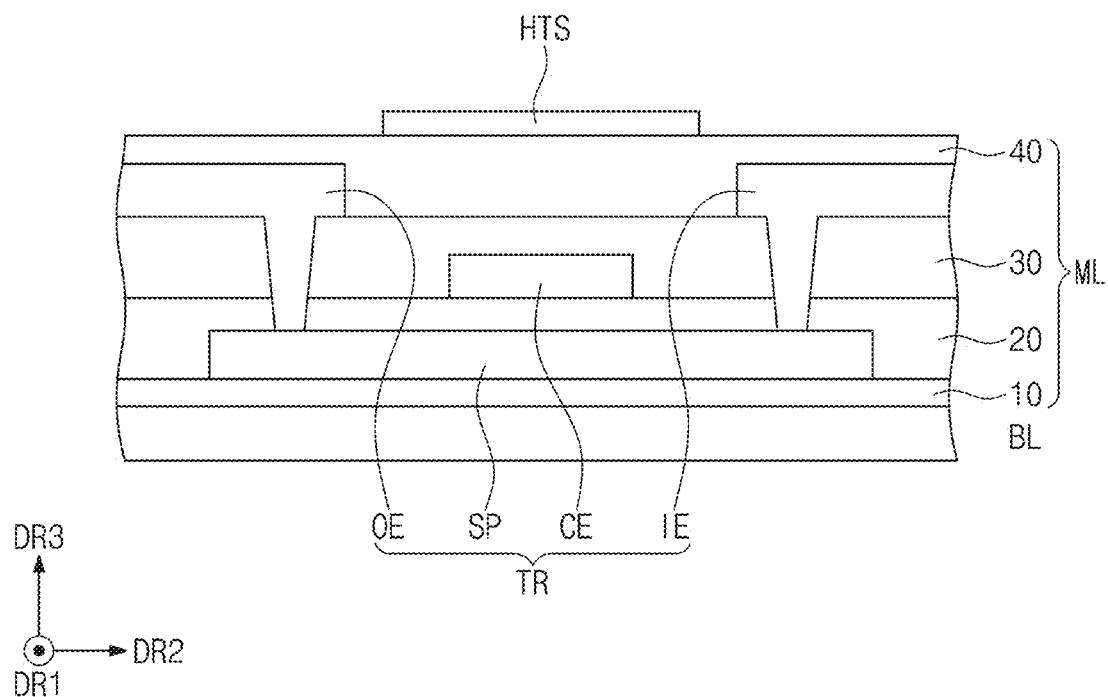
FIGS. 9A to 9E are schematic cross-sectional views that illustrate a manufacturing method of an electronic device according to an embodiment.

In relation to FIG. 9A, the heat sink layer HTS may be formed on the circuit layer ML. The heat sink layer HTS may be a metal thin film layer having excellent heat conductivity and light reflectance.

Figure 9B:
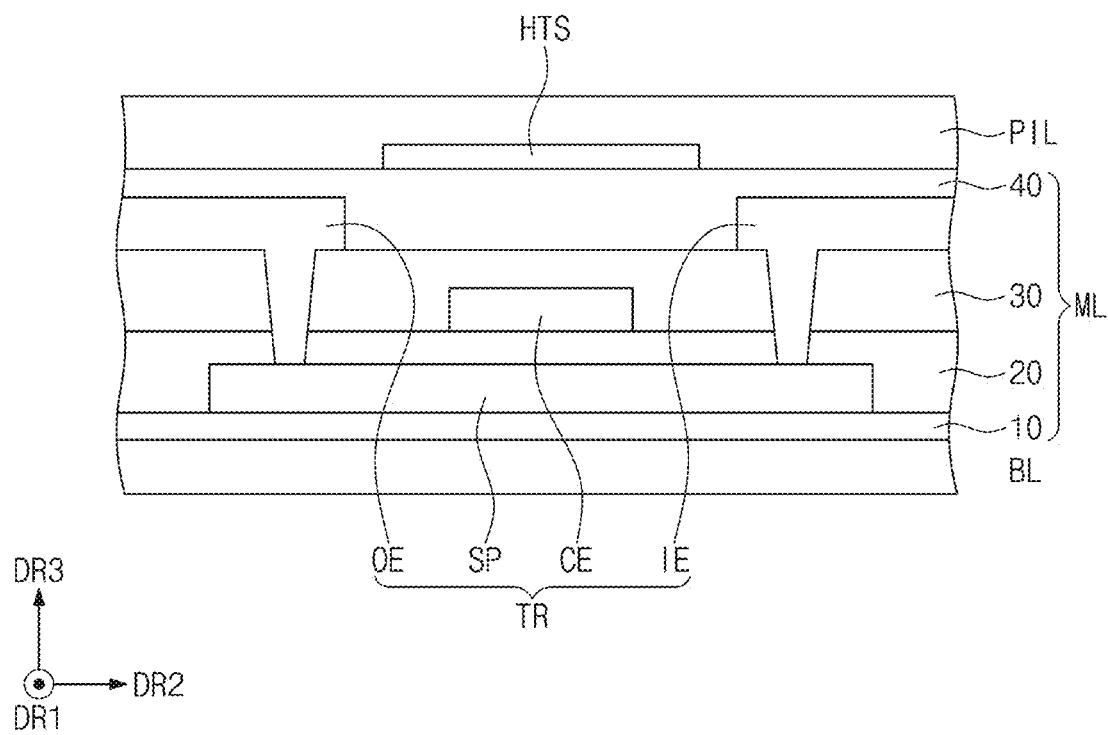

In relation to FIG. 9B, the insulation layer PIL covering or overlapping the heat sink layer HTS may be formed on the circuit layer ML. The insulation layer PIL may be coated on the circuit layer ML. For example, a spin coating process may be employed in forming the insulation layer PIL.

Figure 9C:
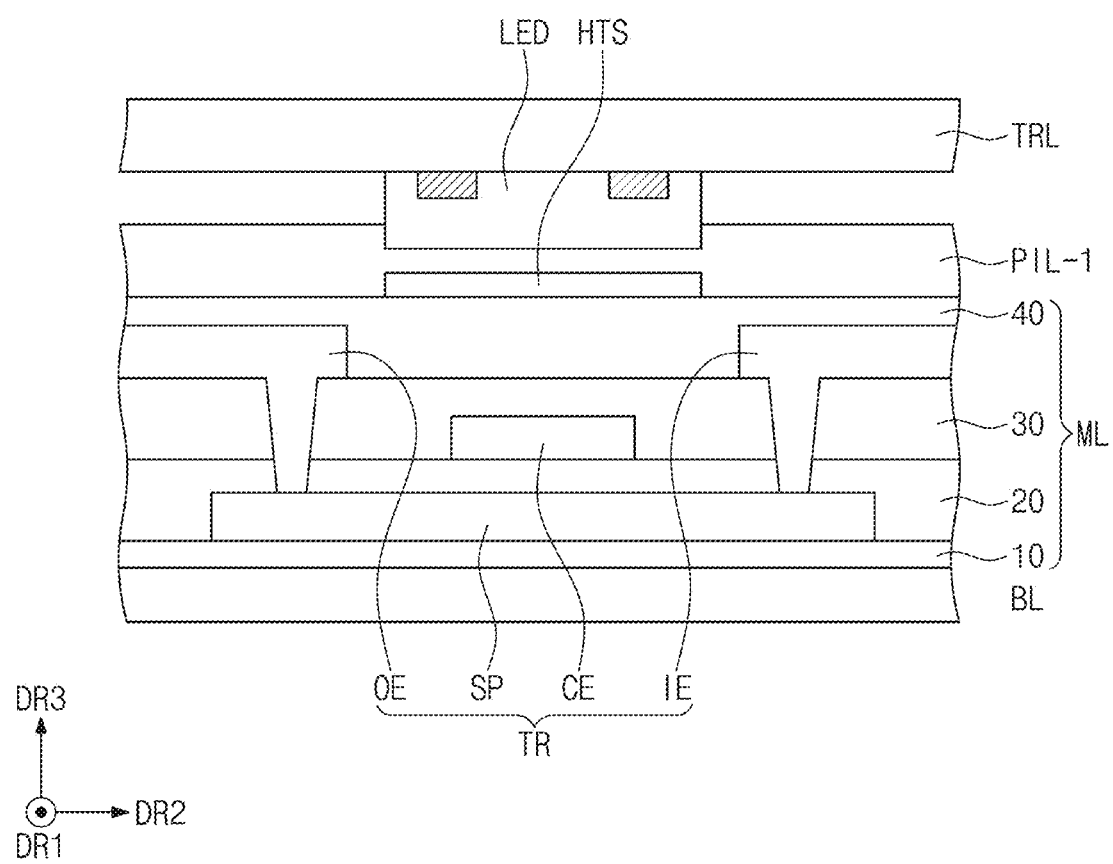

In relation to FIGS. 9B and 9C, the light emitting element LED and the transport layer TRL may be sequentially disposed on the insulation layer PIL. In other words, in a schematic cross-sectional view, the heat sink layer FITS on the circuit layer ML, the insulation layer PIL on the heat sink layer HTS, the light emitting element LED on the insulation layer PIL, and the transport layer TRL on the light emitting element LED may be sequentially disposed.

The insulation layer PIL may be dried to provide the dried insulation layer PIL-1. A solvent amount for the dried insulation layer PIL-1 may be smaller than that for the insulation layer PIL. The light emitting element LED may be put in contact with the dried insulation layer PIL-1. The adhesion between the dried insulation layer PIL-1 and the light emitting element LED may be larger than that between the transport layer TRL and the light emitting element LED.

Figure 9D:
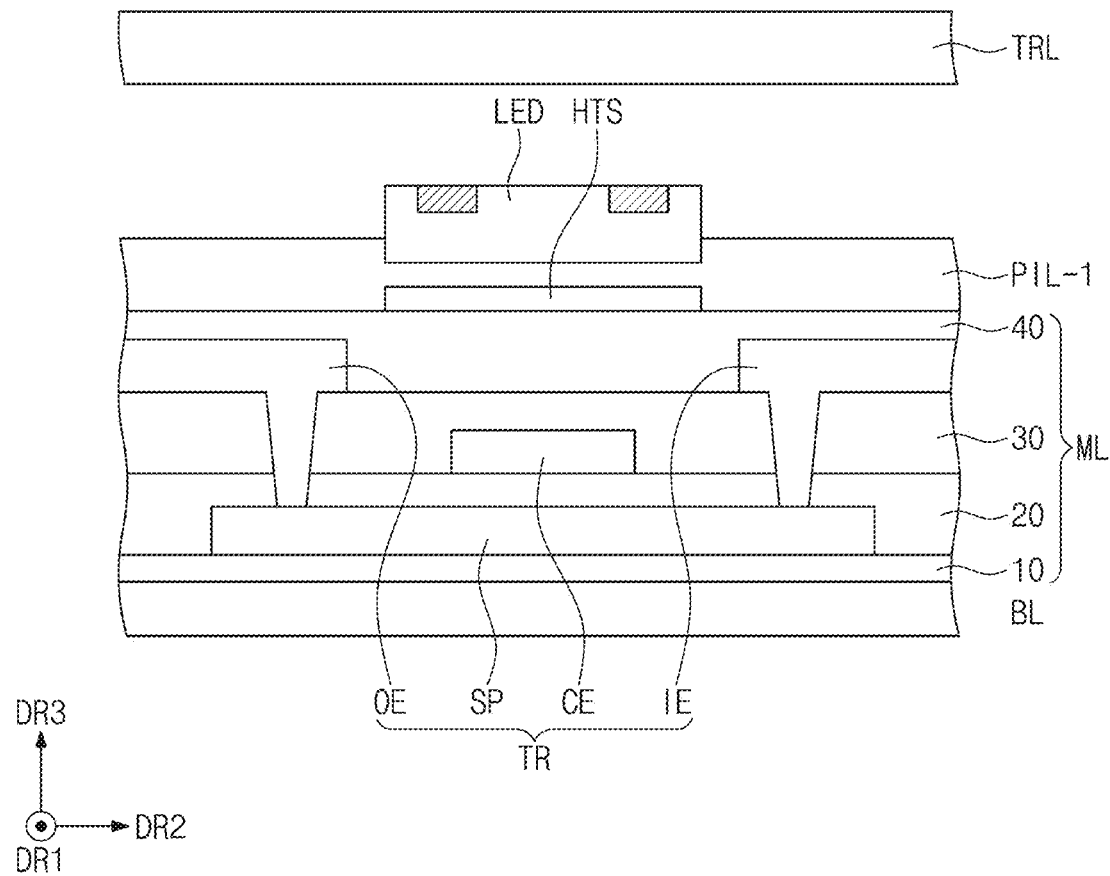

Referring to FIG. 9D, after the light emitting element LED is put in contact with the dried insulation layer PIL-1, the transport layer TRL may be separated from the light emitting element LED. While the light emitting element LED is transferred, the thickness of a partial region of the dried insulation layer PIL-1 may be reduced due to the disposition of the light emitting element LED with the partial region of the dried insulation layer PIL-1.

Figure 9E:
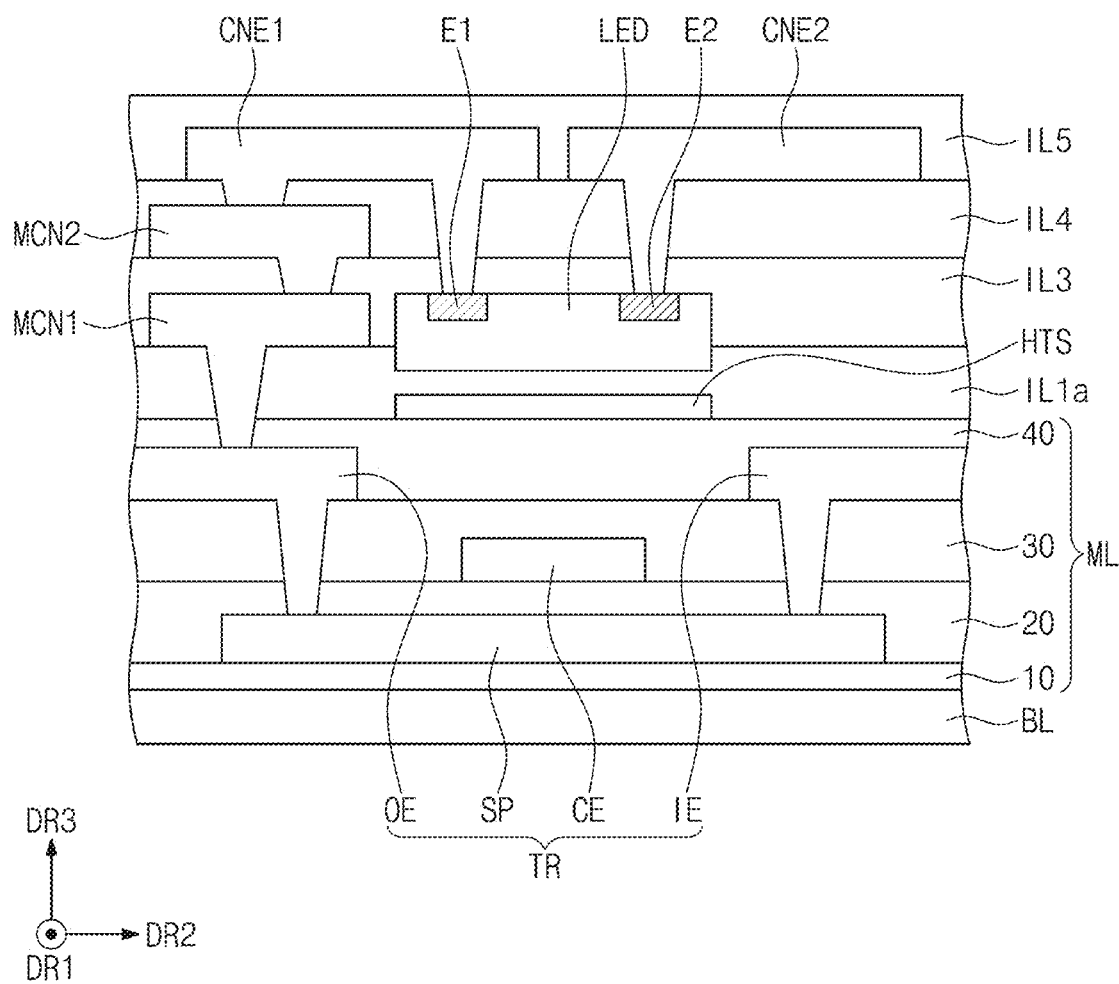

Referring to FIG. 9E, the dried insulation layer PIL-1 may be baked to form the first insulation layer IL1a. The first intermediate electrode MCN1, the third insulation layer IL3, the second intermediate electrode MCN2, and the fourth insulation layer IL4 may be sequentially formed on the first insulation layer IL1a. The first connection electrode CNE1 and the second connection electrode CNE2 may be formed to electrically connect the light emitting element LED with the circuit layer ML.

Figure 10:
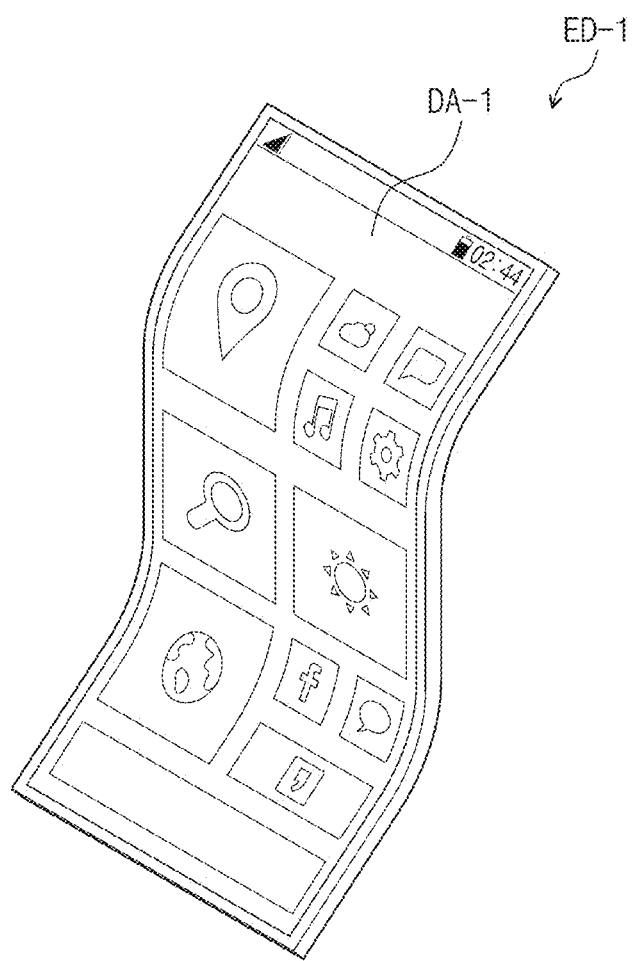
FIG. 10 is a perspective view of an electronic device according to an embodiment.

FIG. 10 is a perspective view of an electronic device ED-1 according to an embodiment.

Referring to FIG. 10, the electronic device ED-1 may be a flexible electronic device ED-1. The flexible electronic device ED-1 may be formed according to various shapes, which may be able to be manipulated, e.g., bent or flexed, from an original shape. The flexible electronic device ED-1 may provide an image on a display area DA-1, which itself may be flexible.

The flexible electronic device ED-1 has a flexible property, and thus even when the shape is manipulated, cracks do not occur in components constituting the flexible electronic device ED-1.

Figure 11:
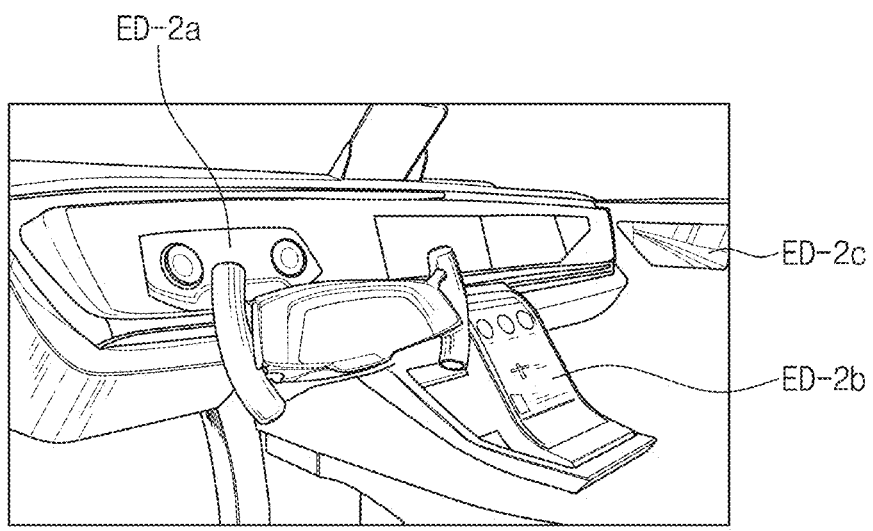
FIG. 11 illustrates an environment in which an electronic device may be used according to an embodiment.

FIG. 11 illustrates an environment in which an electronic device according to an embodiment may be used.

Referring to FIG. 11, electronic devices ED-2a, ED-2b, and ED-2c may be mounted inside a vehicle. For example, the electronic devices ED-2a, ED-2b, and ED-2c may include a first electronic device ED-2a that displays various pieces of information required for driving the vehicle, a second electronic device ED-2b that operates various systems such as an air conditioner, a heater, an audio device, and an air circulator, and a third electronic device ED-2c that displays a rear side image.

A mount surface of the vehicle, on which the first to third electronic devices ED-2a, ED-2b, and ED-2c are mounted, may be curved. According to an embodiment, the first to third electronic devices ED-2a, ED-2b, and ED-2c may be stretched in correspondence to the shape of the curved mount surface. Accordingly, the stretchable electronic device according to an embodiment may be easily mounted on various mount surfaces.

Figure 12A:
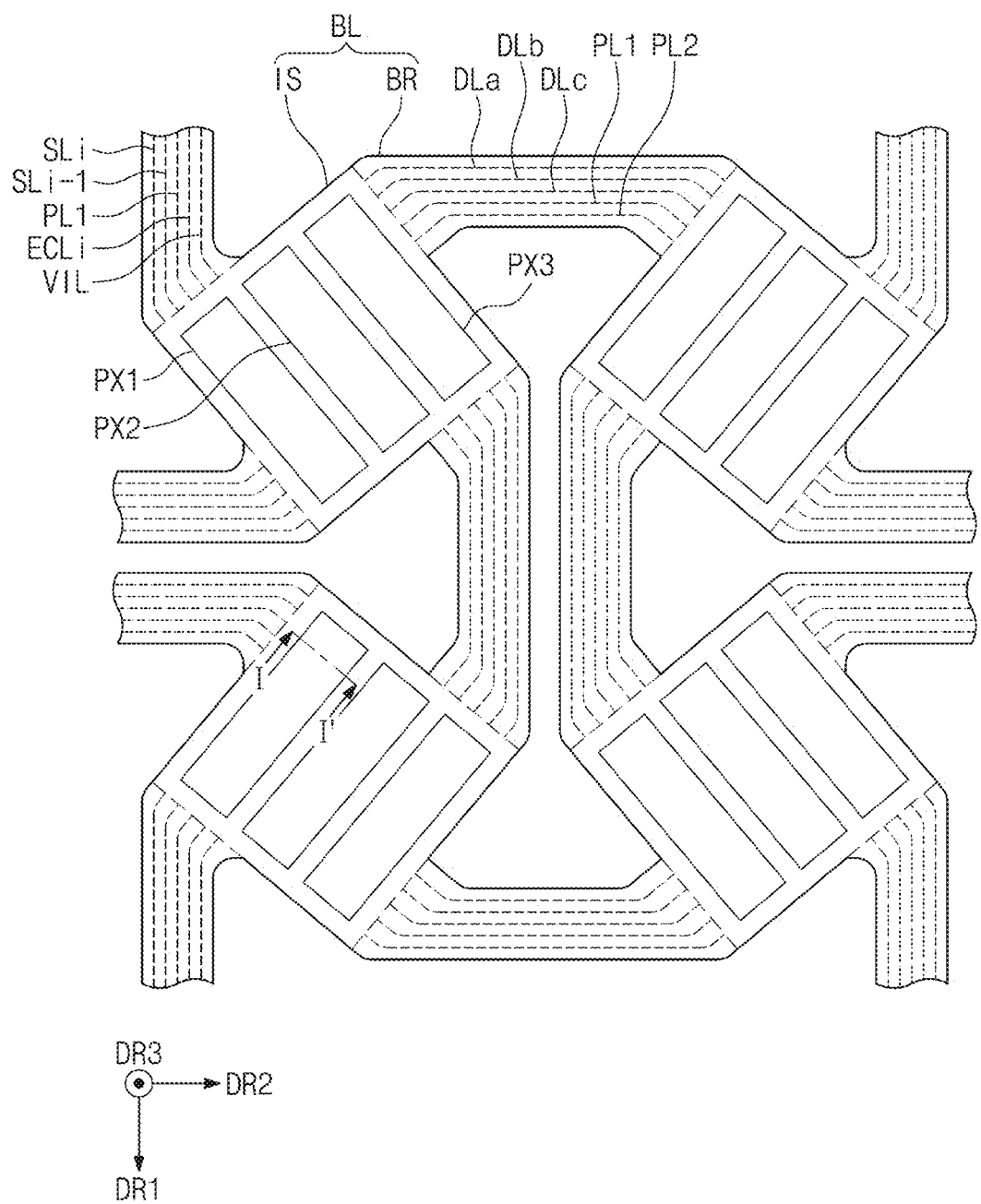
FIG. 12A is a schematic plan view of an electronic device according to an embodiment.

FIG. 12A is a schematic plan view of an electronic device according to an embodiment.

Referring to FIG. 12A, a plan view of each of the electronic devices ED-2a, ED-2b and ED-2c shown in FIG. 11 is illustrated.

A base layer BL of the stretchable electronic devices ED-2a, ED-2b, and ED-2c may include island portions IS and bridge portions BR.

The island portions IS may be arrayed along a first direction DR1 and a second direction DR2. The bridge portions BR may be connected to the island portions IS. For example, adjacent island portions IS may be connected to each other through at least one bridge portion BR. When the base layer BL is stretched, an interval between the island portions IS may increase. For example, the shapes or the positions of the bridge portions BR may be deformed without the shapes of the island portions IS themselves being deformed.

At least one pixel may be disposed in each of the island portions IS. FIG. 12A illustrate that first to third pixels PX1, PX2, and PX3 are disposed in one island portion IS. The first pixel PX1 may be a blue pixel, the second pixel PX2 may be a green pixel, and the third pixel PX3 may be a red pixel.

Each of the first to third pixels PX1, PX2, and PX3 may include the pixel circuit CC (see FIG. 3) and the light emitting element LED (see FIG. 3), and the pixel circuit CC may include transistors T1 to T7 (see FIG. 3). In other words, the transistors T1 to T7 and the light emitting element LED (see FIG. 3) may be disposed on the island portions IS.

The first to third pixels PX1, PX2, and PX3 illustrated in FIG. 12A may correspond to pixel regions from which light is provided. For reference, the cross-sectional view illustrated in FIG. 4A may be a cross-sectional view cut along line I-I' in FIG. 12A. One pixel region may correspond to a region from which light is provided by one light emitting element LED (see FIG. 4A).

Signal lines SLi, SLi–1, ECLi, DLa, DLb, DLc, PL1, PL2, and VIL electrically connected to the pixel circuit CC may be disposed on the bridges portions BR. For example, a first data line DLa may be electrically connected to the first pixel PX1, a second data line DLb may be electrically connected to the second pixel PX2, and a third data line DLc may be electrically connected to the third pixel PX3. An i-th scan line SLi, an (i–1)-th scan line SLi–1, an emission control line ECLi, a first power line PL1, a second power line PL2, and an initialization power line VIL may be electrically connected to each of the first to third pixels PX1, PX2, and PX3.

Figure 12B:
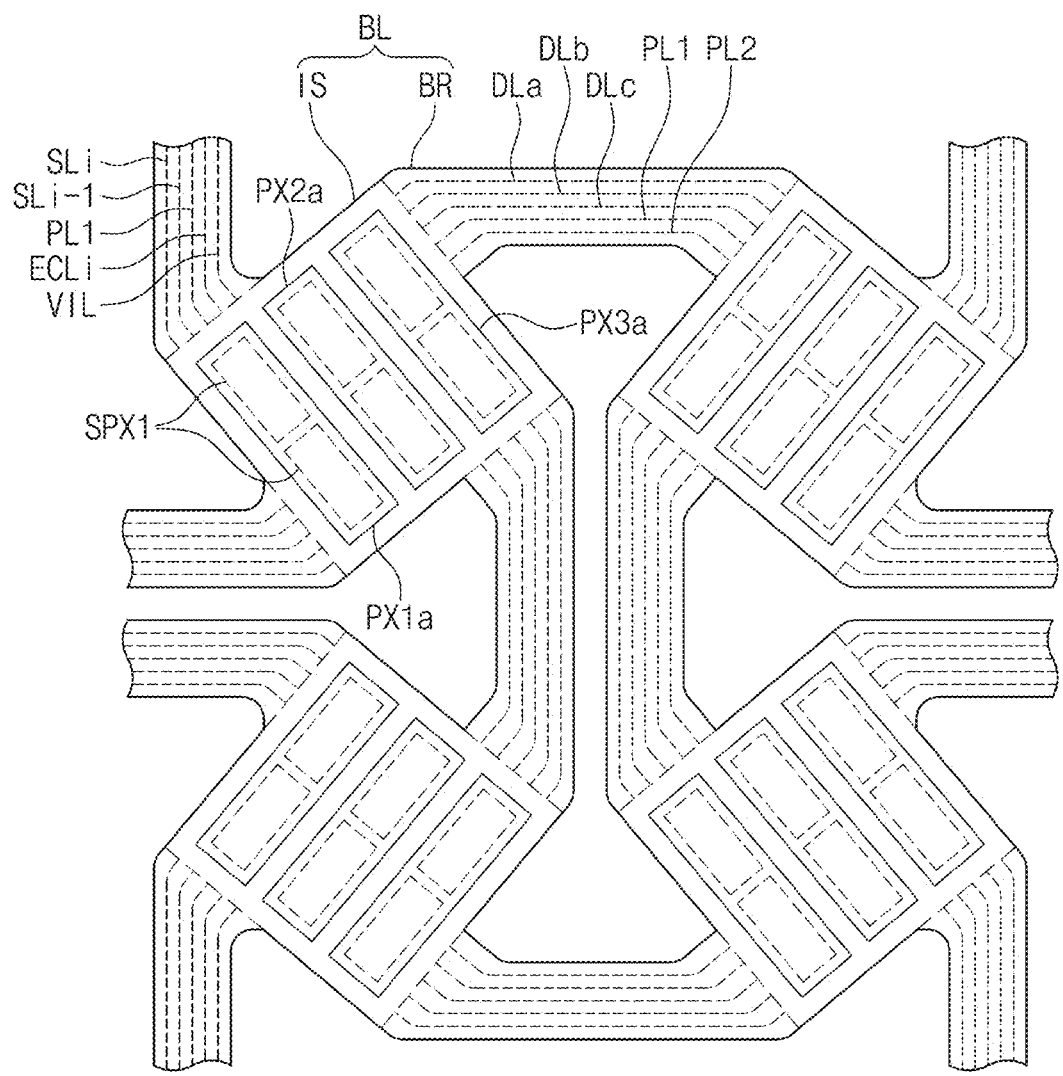
FIG. 12B is a schematic plan view of an electronic device according to an embodiment.
Figure 12B:
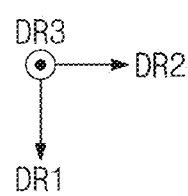

FIG. 12B is a schematic plan view of an electronic device according to an embodiment.

Referring to FIG. 12B, at least one pixel may be disposed in each of the island portions IS. In FIG. 12B, the first to third pixels PX1*a*, PX2*a* and PX3*a* may be disposed in one island portion IS.

Each of the first to third pixels PX1*a*, PX2*a*, and PX3*a* may include a pixel circuit CC (see FIG. 3) and two or more light emitting elements LED (see FIG. 3). FIG. 12B illustrates two pixel regions SPX1 respectively corresponding to two light emitting elements LED of each of the first to third pixels PX1*a*, PX2*a*, and PX3*a*. According to an embodiment, even when one light emitting element LED is abnormal, light may be provided by another light emitting element LED. Accordingly, reliability of light emission may be improved.

Figure 13:
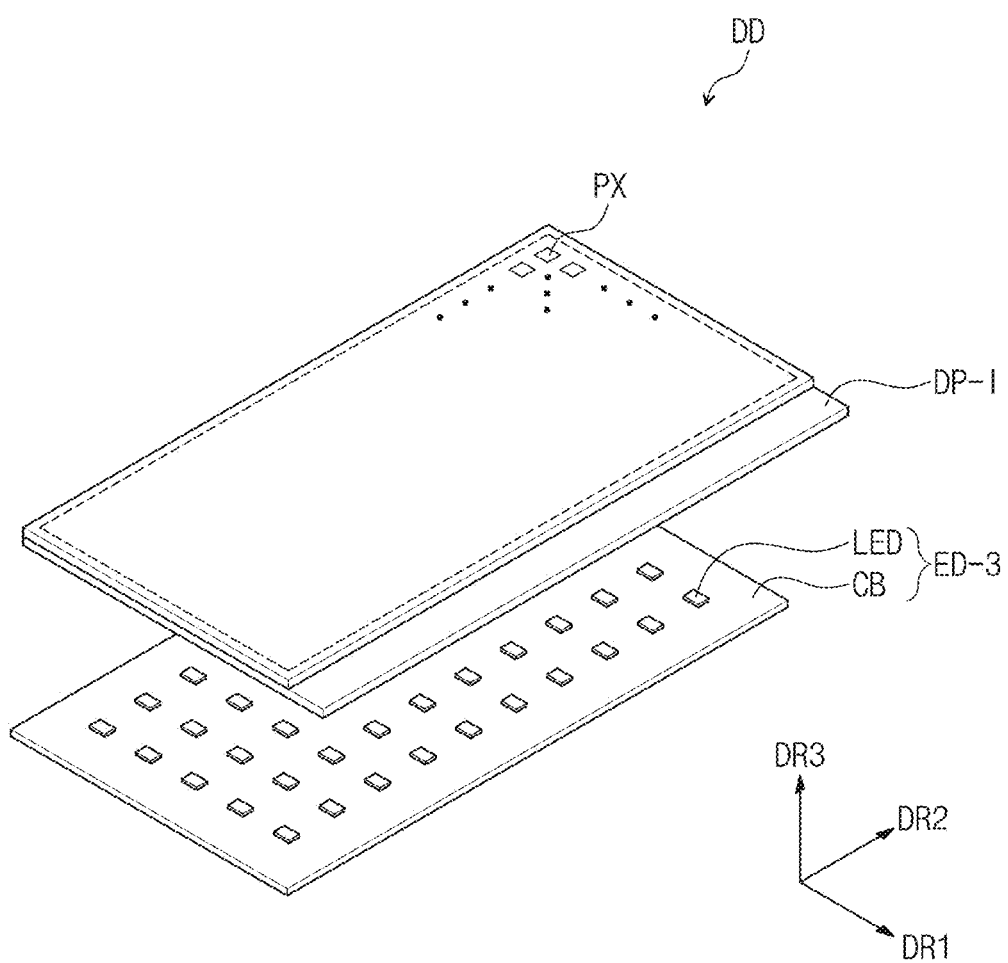
FIG. 13 is an exploded perspective view of a display device according to an embodiment.

FIG. 13 is an exploded perspective view of a display device according to an embodiment.

Referring to FIG. 13, a display device DD may be a liquid crystal display device. The display device DD may include a display panel DP-I and the electronic device ED-3.

The display panel DP-I may control the transmissivity of each pixel PX to implement an image on the basis of the provided light. In an embodiment, the display panel DP-I may be a light transmissive display panel, for example, a liquid crystal display panel.

The electronic device ED-3 may be disposed under the display panel DP-I. The electronic device ED-3 may face the display panel DP-I and provide light thereto.

The electronic device ED-3 may be a light source unit, and include a circuit board CB and light emitting elements LED. The circuit board CB may be disposed under the display panel DP-I. The circuit board CB may have the shape of a plate facing the display panel DP-I. Although not shown in the drawing, the circuit board CB may include a base substrate and circuit lines mounted on the base substrate. The circuit lines may receive electrical signals from the outside to deliver the electrical signals to the light emitting elements LED, or electrically connect the light emitting elements LED.

Each of the light emitting elements LED generates light. The light emitting elements LED may be disposed on the circuit board CB to be electrically connected thereto. The light emitting elements LED may be arrayed separately from each other. The light emitting elements LED may be arrayed in parallel along a first direction DR1 and a second direction DR2.

The light emitting elements LED may be disposed between the circuit board CB and the display panel DP-I to provide light to the display panel DP-I. Each of the light emitting elements LED may include a micro light emitting element. Each of the light emitting elements LED may be transferred onto the circuit board CB by applying the method illustrated in FIGS. 7A to 7F, FIGS. 8A to 8C, or FIGS. 9A to 9E.

According to embodiments of the disclosure, a light emitting element may be transferred onto a circuit layer using a constituent insulation layer. The insulation layer may include a material that is applicable to the electronic device. Accordingly, an additional, separate adhesive layer, which may otherwise be used for transferring the light emitting element onto the circuit layer, may be omitted. In addition, since the light emitting element is transferred onto the circuit layer, as described, the reliability of the electronic device may be enhanced as potential interference from or malfunction of the separate adhesive is avoided.

While the embodiments have been described herein as above, it will be clear to those of ordinary skill in the art that various changes and modifications may be made to the described embodiments without departing from the spirit and scope of the disclosure as defined in the appended claims and their equivalents. Thus, the scope of the disclosure shall not be restricted or limited by the foregoing description, but may be determined by the broadest permissible interpretation of the following claims.

What is claimed is:

1. A manufacturing method of an electronic device, comprising:
   forming a circuit layer on a base layer, the circuit layer comprising a thin-film transistor;
   disposing an insulation layer on the circuit layer;
   transferring a light emitting element over the circuit layer such that the insulation layer is disposed between the light emitting element and the circuit layer;
   drying the insulation layer so as to attach the light emitting element with the insulation layer and the and thin-film transistor;
   forming a first insulation layer disposed between the light emitting element and the ciruit layer by patterning the insulation layer;
   disposing a second insulation layer on the circuit layer and around the light emitting element and the first insulation layer; and
   forming a connection electrode directly in contact with the light emitting element and electrically connecting the light emitting element and the circuit layer, wherein
   a bottom surface of the light emitting element is in contact with the first insulation layer, and the connection electrode is in contact with an upper surface of the light emitting element opposing the bottom surface of the light emitting element, and
   in a plan view, an area of the first insulation layer corresponds to an area of the light emitting element so as to have a same size as that of the light emitting element.

2. The manufacturing method of claim 1, wherein
   the disposing of the insulating layer comprises coating the insulation layer on the circuit layer, and
   the disposing of the light emitting element comprises attaching the light emitting element with the insulation layer.

3. The manufacturing method of claim 2, wherein
   the disposing of the light emitting element comprises detaching the light emitting element from a transport layer.

4. The manufacturing method of claim 3, wherein the transport layer comprises an ultraviolet curable tape, and the detaching of the light emitting element comprises irradiating the transport layer with an ultraviolet ray.

5. The manufacturing method of claim 1, wherein the disposing of the light emitting element comprises attaching the light emitting element on a transport layer, and the disposing of the insulating layer comprises coating the insulation layer on the transport layer and the light emitting element.

6. The manufacturing method of claim 5, wherein
   the disposing of the light emitting element comprises detaching the light emitting element and a portion of the insulating layer coated thereon from the transport layer and another portion of the insulating layer coated on the transport layer.

7. The manufacturing method of claim 1, wherein the insulation layer comprises a polyimide-based resin.

8. The manufacturing method of claim 1, further comprising:
patterning the insulation layer by employing the light emitting element as a mask.

9. The manufacturing method of claim 1, wherein the insulation layer has a thinner thickness than a thickness of the light emitting element.

10. The manufacturing method of claim 2, wherein the attaching of the light emitting element comprises heating the insulation layer.

11. The manufacturing method of claim 1, wherein the base layer comprises island portions and bridge portions connecting the island portions.

12. A method for attaching a light emitting element to a substrate, comprising:
disposing an insulation layer on the substrate;
disposing a light emitting element on a transport layer so that a first electrode and a second electrode of light emitting element contact the transport layer;
transferring the light emitting element and the transport layer to a position over the substrate to cause the insulation layer to be located between the light emitting element and the substrate to be in contact with both the substrate and the light emitting element;
drying the insulation layer while the insulation layer is in contact with both the substrate and the light emitting element to attach the light emitting element with the substrate;
separating the transport layer from the light emitting element after the light emitting element is attached to the substrate;
forming a first insulation layer disposed between the light emitting element and the substrate by patterning the insulation layer; and
disposing a second insulation layer on the substrate and around the light emitting element and the first insulation layer,
wherein, in a plan view, an area of the first insulation layer corresponds to an area of the light emitting element so as to have a same size as that of the light emitting element.

13. The method of claim 12, wherein the disposing of the insulating layer comprises coating the insulation layer on the substrate.

14. The method of claim 12, wherein the disposing of the insulating layer comprises coating the insulation layer on the transport layer and the light emitting element.

15. The method of claim 12, wherein the transport layer comprises an ultraviolet curable tape, and the separating comprises irradiating the ultraviolet curable tape with an ultraviolet ray.

* * * * *